(12) United States Patent
Funabiki et al.

(10) Patent No.: US 8,601,656 B2
(45) Date of Patent: Dec. 10, 2013

(54) METHOD OF MANUFACTURING A PIEZOELECTRIC VIBRATOR

(75) Inventors: Yoichi Funabiki, Chiba (JP); Masashi Numata, Chiba (JP); Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 222 days.

(21) Appl. No.: 13/175,189

(22) Filed: Jul. 1, 2011

(65) Prior Publication Data

US 2011/0261658 A1 Oct. 27, 2011

Related U.S. Application Data

(63) Continuation of application No. PCT/JP2009/053335, filed on Feb. 25, 2009.

(51) Int. Cl.
*H03H 9/21* (2006.01)
*H03H 9/10* (2006.01)

(52) U.S. Cl.
USPC .............. 29/25.35; 29/830; 29/852; 310/344; 310/348

(58) Field of Classification Search
USPC ......... 29/25.35, 594, 830, 842, 852; 310/340, 310/348, 365, 344
See application file for complete search history.

(56) References Cited

U.S. PATENT DOCUMENTS 5,325,574 A * 7/1994 Takagi et al. ................. 29/25.35
5,611,129 A * 3/1997 Yoshimoto et al. .......... 29/25.35

FOREIGN PATENT DOCUMENTS

| JP | 03-276790 A | | 12/1991 | |
|----|----|----|----|----|
| JP | 06283951 A | * | 10/1994 | .................. 29/25.35 |
| JP | 2001-267190 A | | 9/2001 | |
| JP | 2002124845 A | * | 4/2002 | |
| JP | 2003-209198 A | | 7/2003 | |
| JP | 2007-328941 A | | 12/2007 | |

OTHER PUBLICATIONS

Machine Language Translation of Japanese Patent Publication, JP 2003-209198.*
Machine Language Translation of Japanese Patent Publication, JP 6-283951.*
Machine Language Translation of Japanese Patent Publication, JP 2002-124845.*
International Search Report for International Application No. PCT/JP2009/053335, dated May 19, 2009, 1 page.

* cited by examiner

*Primary Examiner* — A. Dexter Tugbang
(74) *Attorney, Agent, or Firm* — Brinks Gilson & Lione

(57) ABSTRACT

A method of manufacturing a piezoelectric vibrator according to the invention is a method of manufacturing a piezoelectric vibrator in which a piezoelectric vibrating reed is sealed in a cavity formed between a base substrate and a lid substrate bonded to each other, the method including the steps of: inserting a core portion of a conductive rivet member, which includes a planar head portion and the core portion extending in a direction vertically to the surface of the head portion, into a penetration hole of the base substrate and bringing the head portion of the rivet member into contact with a first surface of the base substrate; attaching a laminate material having elastic properties to the first surface of the base substrate so as to cover the head portion; applying a paste-like glass frit on a second surface of the base substrate and filling the glass frit in the penetration hole; and baking and curing the glass frit.

4 Claims, 18 Drawing Sheets

METHOD OF MANUFACTURING A PIEZOELECTRIC VIBRATOR

RELATED APPLICATIONS

This application is a continuation of PCT/JP2009/053335 filed on Feb. 25, 2009. The entire content of this application is incorporated herein by reference.

BACKGROUND OF THE INVENTION

1. Field of the Invention

The present invention relates to a method of manufacturing a surface mounted device (SMD)-type piezoelectric vibrator in which a piezoelectric vibrating reed is sealed in a cavity formed between two bonded substrates, and an oscillator, an electronic device, and a radio-controlled timepiece each having the piezoelectric vibrator.

2. Description of the Related Art

In recent years, a piezoelectric vibrator utilizing crystal or the like has been used in mobile phones and mobile information terminals as the time source, the timing source of a control signal, a reference signal source, and the like. Although there are various piezoelectric vibrators of this type, a surface mounted device-type piezoelectric vibrator is known as one example thereof. As the piezoelectric vibrator of this type, generally, a three-layered piezoelectric vibrator in which a piezoelectric substrate having a piezoelectric vibrating reed formed thereon is bonded so as to be interposed from above and below by the base substrate and a lid substrate is known. In this case, the piezoelectric vibrator is accommodated in a cavity (sealed space) that is formed between the base substrate and the lid substrate. Moreover, in recent years, instead of the three-layered piezoelectric vibrator described above, a two-layered piezoelectric vibrator has also been developed.

The piezoelectric vibrator of this type has a two-layer structure in which a base substrate and a lid substrate are directly bonded, and a piezoelectric vibrating reed is accommodated in a cavity formed between the two substrates. The two-layered piezoelectric vibrator is ideally used as it is superior in achieving a thin profile compared with the three-layered structure. As an example of such a two-layered piezoelectric vibrator, a piezoelectric vibrator in which a piezoelectric vibrating reed is electrically connected to external electrodes formed on a base substrate using a conductive member which is formed so as to penetrate through the base substrate is known (for example, see Patent Citations 1 and 2).

This piezoelectric vibrator 200 includes a base substrate 201 and a lid substrate 202 which are anodically bonded to each other by a bonding film 207 and a piezoelectric vibrating reed 203 which is sealed in a cavity C formed between the two substrates 201 and 202, as shown in FIGS. 28 and 29. The piezoelectric vibrating reed 203 is a tuning-fork type vibrating reed, for example, and is mounted on the upper surface of the base substrate 201 in the cavity C by a conductive adhesive E.

The base substrate 201 and the lid substrate 202 are insulating substrates, for example, made of ceramics, glass, and the like. Among the two substrates 201 and 202, through holes 204 are formed on the base substrate 201 so as to penetrate through the base substrate 201. Moreover, a conductive member 205 is embedded in the through holes 204 so as to block the through holes 204. The conductive member 205 is electrically connected to external electrodes 206 which are formed on the lower surface of the base substrate 201 and is electrically connected to the piezoelectric vibrating reed 203 mounted in the cavity C.

Patent Citation 1: JP-A-2001-267190
Patent Citation 2: JP-A-2007-328941

In the two-layered type piezoelectric vibrator described above, the conductive member 205 performs two major roles of blocking the through holes 204 to maintain the airtightness in the cavity C and electrically connecting the piezoelectric vibrating reed 203 and the external electrode 206 to each other. In particular, if the contact between the conductive member 205 and the through holes 204 is not sufficient, there is a possibility that the airtightness in the cavity C is impaired. Moreover, if the contact between the conductive member 205 and the conductive adhesive E or the external electrode 206 is not sufficient, the piezoelectric vibrating reed 203 will not operate properly. Therefore, in order to eliminate such a problem, it is necessary to form the conductive member 205 in a state where the conductive member 205 is tightly and closely adhered to the inner surfaces of the through holes 204 to completely block the through holes 204, and no depression or the like appears on the surface.

Patent Citations 1 and 2 describe that the conductive member 205 is formed using a conductive paste (an Ag paste, an Au—Sn paste, or the like). However, there is no description as to a specific manufacturing method such as how to form the conductive member.

In general, when a conductive paste is used, it is necessary to perform baking to cure the conductive paste. That is, it is necessary to perform baking to cure the conductive paste after it is filled in the through holes 204. However, when baking is performed, since organic materials included in the conductive paste are removed through evaporation, the volume of the conductive paste after baking generally decreases compared to the volume of the conductive paste before baking (for example, the volume decreases approximately 20% when an Ag paste is used as the conductive paste). Therefore, even when the conductive member 205 is formed using the conductive paste, there is a possibility that depressions appear on the surface, or in severe cases, the centers of the penetration holes are opened. As a result, there is a possibility that the airtightness in the cavity C is impaired, or the electrical connection between the piezoelectric vibrating reed 203 and the external electrode 206 is impaired.

In order to solve the problems described above, a technique of filling a glass paste in the through holes 204 in a state where a conductive rivet member is inserted into the through holes 204 and integrating the glass paste with the through holes 204 by performing baking is proposed.

However, there is a problem in that if the contact surfaces of the rivet member and the base substrate 201 are not sufficiently in contact with each other when filling the glass paste, the glass paste leaks. Moreover, there is also a problem in that a load is applied to the contact surfaces of the rivet member and the base substrate 201 when filling the glass paste in the through holes 204, cracks are formed in the base substrate 201. Therefore, there is a problem in that the yield decreases when manufacturing the piezoelectric vibrator.

SUMMARY OF THE INVENTION

The invention has been made in view of the above problems, and an object of the invention is to provide a method of manufacturing a piezoelectric vibrator capable of securely maintaining the airtightness in a cavity and improving the yield, and to provide an oscillator, an electronic device, and a radio-controlled timepiece each having the piezoelectric vibrator.

In order to solve the problems, the invention provides the following means.

A method of manufacturing a piezoelectric vibrator according to the invention is a method of manufacturing a piezoelectric vibrator in which a piezoelectric vibrating reed is sealed in a cavity formed between a base substrate and a lid substrate bonded to each other, the method including the steps of: inserting a core portion of a conductive rivet member, which includes a planar head portion and the core portion extending in a direction vertical to the surface of the head portion, into a penetration hole of the base substrate and bringing the head portion of the rivet member into contact with a first surface of the base substrate; attaching a laminate material having elastic properties to the first surface of the base substrate so as to cover the head portion; applying a paste-like glass frit on a second surface of the base substrate and filling the glass frit in the penetration hole; and baking and curing the glass frit.

In the method of manufacturing the piezoelectric vibrator according to the invention, when forming the penetration electrode on the base substrate, the glass frit is filled in the penetration hole in a state where the laminate material is attached to the base substrate so as to cover the head portion of the rivet member. Therefore, since the rivet member and the base substrate are held by the laminate material, it is possible to prevent the rivet member from falling off from the base substrate when filling the glass frit. Moreover, since the base substrate and the rivet member can be held by the laminate material without any gap, it is possible to prevent leakage of the glass frit. Furthermore, since the load applied to the contact surface between the base substrate and the rivet member when filling the glass frit can be reduced by the laminate material, it is possible to prevent the occurrence of cracks in the base substrate. That is, it is possible to form the penetration electrode while reliably maintaining the airtightness in the cavity. Moreover, it is possible to prevent the leakage of the glass frit and the occurrence of cracks in the base substrate and to improve the yield.

Alternatively, a method of manufacturing a piezoelectric vibrator according to the invention is a method of manufacturing a piezoelectric vibrator using a base substrate wafer and a lid substrate wafer, the method including: a recess forming step of forming a cavity recess on the lid substrate wafer so as to form the cavity when the two wafers are superimposed on each other; a penetration electrode forming step of forming a penetration electrode on the base substrate wafer using the rivet member so as to penetrate through the base substrate wafer; a lead-out electrode forming step of forming a lead-out electrode on the first surface of the base substrate wafer so as to be electrically connected to the penetration electrode; a mounting step of bonding the piezoelectric vibrating reed to the first surface of the base substrate wafer with the lead-out electrode disposed therebetween; a superimposition step of superimposing the base substrate wafer and the lid substrate wafer on each other so that a piezoelectric vibrating reed is received in the cavity surrounded by the recess and the two wafers; a bonding step of bonding the base substrate wafer and the lid substrate wafer to each other so that the piezoelectric vibrating reed is sealed in the cavity; an external electrode forming step of forming an external electrode on the second surface of the base substrate wafer so as to be electrically connected to the penetration electrode; and a cutting step of cutting the two bonded wafers to obtain a plurality of fragmented piezoelectric vibrators, wherein the penetration electrode forming step includes: a penetration hole forming step of forming a penetration hole for disposing a penetration electrode in the base substrate wafer; a rivet member disposing step of disposing a core portion of the rivet member in the penetration hole of the base substrate wafer; a laminate material attaching step of attaching a laminate material having elastic properties to the first surface of the base substrate wafer so as to cover the head portion of the rivet member; a glass frit filling step of filling a paste-like glass frit in a gap between the penetration hole and the core portion of the rivet member; a baking step of baking the glass frit at a predetermined temperature so that the penetration hole, the glass frit, and the core portion of the rivet member are integrally fixed to each other; and a grinding and polishing step of grinding and polishing the head portion of the rivet member and the first surface of the base substrate wafer in which the head portion is disposed and polishing the second surface of the base substrate wafer to thereby expose the core portion.

In the method of manufacturing the piezoelectric vibrator according to the invention, first a recess forming step of forming a plurality of cavity recesses on the lid substrate wafer is performed. These recesses are recesses which serve as cavities when the two wafers are later superimposed on each other. Moreover, at the same time as or at a time different from the above step, a penetration electrode forming step is performed where a plurality of penetration electrodes is formed on the base substrate wafer using the rivet member and the paste-like glass frit. At this time, the plurality of penetration electrodes is formed so as to be received in the recess formed on the lid substrate wafer when the two wafers are later superimposed on each other.

More specifically, in the penetration electrode forming step, first a penetration hole forming step is performed where a plurality of penetration holes is formed on the base substrate wafer so as to penetrate through the wafer. Subsequently, a rivet member disposing step of disposing a core portion of the rivet member in the penetration holes is performed. At this time, the rivet member is disposed so that the head portion of the rivet member is positioned on the first surface side of the base substrate wafer. Subsequently, a laminate material attaching step of attaching a laminate material having elastic properties to the first surface of the base substrate wafer so as to cover the head portion of the rivet member is performed. Furthermore, a glass frit filling step of filling a paste-like glass frit in a gap between the penetration hole and the core portion of the rivet member without forming any gap is performed. At this time, although force is applied to the contact portion between the first surface of the base substrate wafer and the head portion of the rivet member and the like since the glass frit is filled in the penetration hole using a squeegee or the like, it is possible to prevent the occurrence of cracks in the base substrate wafer since the laminate material performs the role of a cushioning material. Moreover, since the first surface of the base substrate wafer and the rivet member are held by the laminate material without any gap between the first surface and the head portion, it is possible to prevent leakage of the glass frit. Subsequently, a baking step of baking and curing the filled glass frit at a predetermined temperature is performed. In this way, the glass frit is tightly attached to the inner surface of the penetration hole. Moreover, a grinding and polishing step of grinding and polishing the head portion of the rivet member and the first surface of the base substrate wafer and polishing the second surface of the base substrate wafer to thereby expose the core portion is performed.

The penetration electrode forming step ends when the grinding and polishing step is finished. The electrical connection of the penetration electrode is secured by the core portion of the rivet member.

Subsequently, a lead-out electrode forming step of patterning a conductive material on the first surface of the base substrate wafer to form a plurality of lead-out electrodes so as to be electrically connected to the respective penetration electrodes is performed. At this time, the lead-out electrodes are formed so as to be received in the recesses formed on the lid substrate wafer when the two wafers are later superimposed on each other.

Particularly, as described above, the penetration electrodes are approximately flush with the first surface of the base substrate wafer. Therefore, the lead-out electrodes which are patterned on the first surface of the base substrate wafer are closely adhered onto the penetration electrodes without forming any gap or the like therebetween. In this way, it is possible to secure a reliable electrical connection between the lead-out electrodes and the penetration electrodes.

Subsequently, a mounting step of bonding each of a plurality of piezoelectric vibrating reeds to the first surface of the base substrate wafer with the lead-out electrode disposed therebetween is performed. In this way, the respective bonded piezoelectric vibrating reeds are electrically connected to the penetration electrodes through the lead-out electrodes. After the mounting is finished, a superimposition step of superimposing the base substrate wafer and the lid substrate wafer on each other is performed. In this way, the plurality of bonded piezoelectric vibrating reeds is received in the cavity surrounded by the recess and the two wafers.

Subsequently, a bonding step of bonding the two superimposed wafers to each other is performed. In this way, since the two wafers are tightly adhered, the piezoelectric vibrating reeds can be sealed in the cavity. At this time, since the penetration holes formed on the base substrate wafer are blocked by the penetration electrodes, the airtightness in the cavity is not impaired by the penetration holes. In particular, since the glass frit that constitutes the penetration electrodes is tightly adhered to the inner surface of the penetration hole, it is possible to reliably maintain the airtightness in the cavity.

Subsequently, an external electrode forming step of patterning a conductive material on the second surface of the base substrate wafer to thereby form a plurality of external electrodes so as to be electrically connected to the respective penetration electrodes is performed.

In this case, similarly to when forming the lead-out electrode, since the penetration electrodes are approximately flush with the second surface of the base substrate wafer, the patterned external electrodes are closely adhered to the penetration electrodes without forming any gap therebetween. In this way, it is possible to secure a reliable electrical connection between the external electrodes and the penetration electrodes. Through this step, it is possible to operate the piezoelectric vibrating reeds sealed in the cavity using the external electrodes.

Finally, a cutting step of cutting the base substrate wafer and the lid substrate wafer which are bonded to each other to obtain a plurality of fragmented piezoelectric vibrators is performed.

As a result, it is possible to manufacture a plurality of two-layered surface mounted device-type piezoelectric vibrators at once in which the piezoelectric vibrating reeds are sealed in the cavity formed between the base substrate and the lid substrate which are bonded to each other.

In particular, since the penetration electrodes can be formed to be approximately flush with the base substrate, the penetration electrodes can be securely closely adhered to the lead-out electrodes and the external electrodes. As a result, it is possible to secure stable electrical connection between the piezoelectric vibrating reeds and the external electrodes, improve the reliability of operational performance, and realize a high-quality piezoelectric vibrator. Moreover, since reliable airtightness in the cavity can be maintained, in this respect, it is possible to realize a high-quality piezoelectric vibrator. Furthermore, the penetration electrodes can be formed by a simple method using the rivet member and the glass fit, and the yield can be improved just by adding the step of attaching the laminate material. That is, it is possible to simplify the process steps.

Moreover, in the method of manufacturing the piezoelectric vibrator according to the invention, the laminate material may include a tape body formed of sheet and a thermoplastic adhesive applied on the tape body, and the method may include a separation step of separating the laminate material after the step of baking and curing the glass frit.

In the method of manufacturing the piezoelectric vibrator according to the invention, since the adhesive applied on the laminate material is a thermoplastic adhesive, the adhesion force of the thermoplastic adhesive decreases when the glass frit is baked and cured. Therefore, when the laminate material is separated after the step of baking the glass frit is performed, it is possible to easily separate the laminate material from the first surface of the base substrate and the head portion of the rivet member and to improve the production efficiency. Moreover, it is possible to reliably separate the laminate material.

Moreover, in the method of manufacturing the piezoelectric vibrator according to the invention, the laminate material may have a thickness of 50 µm or more and 200 µm or less.

In the method of manufacturing the piezoelectric vibrator according to the invention, since the thickness of the laminate material is set to an appropriate range, it is possible to obtain cushioning properties appropriate for the laminate material and to prevent the occurrence of cracks in the base substrate when filling the glass frit in the penetration holes. In addition, if the laminate material is too thin, since it is not possible to obtain appropriate cushioning properties, there is a possibility that a crack is formed in the base substrate. Conversely, if the laminate material is too thick, since the cushioning properties increase too much, there is a possibility that force is applied to the contact portion between the base substrate and the rivet member, and a crack is formed in the base substrate.

Moreover, an oscillator according to the invention includes the piezoelectric vibrator manufactured by the above-described manufacturing method which is electrically connected to an integrated circuit as an oscillating piece.

Furthermore, the electronic device according to the invention includes the piezoelectric vibrator manufactured by the above-described manufacturing method which is electrically connected to a clock section.

In addition, a radio-controlled timepiece according to the invention includes the piezoelectric vibrator manufactured by the above-described manufacturing method which is electrically connected to a filter section.

Since each of the oscillator, electronic device, and radio-controlled timepiece according to the invention includes the high-quality piezoelectric vibrator in which reliable airtightness in the cavity is secured, and the yield is improved, it is possible to achieve an improvement in the operational reliability and the quality of the oscillator, electronic device, and radio-controlled timepiece.

According to the method of manufacturing the piezoelectric vibrator according to the invention, when forming the penetration electrode on the base substrate, the glass frit is filled in the penetration hole in a state where the laminate material is attached to the base substrate so as to cover the head portion of the rivet member. Therefore, since the rivet member and the base substrate are held by the laminate material, it is possible to prevent the rivet member from falling off from the base substrate when filling the glass frit. Moreover, since the base substrate and the rivet member can be held by the laminate material without any gap, it is possible to prevent leakage of the glass frit. Furthermore, since the load applied to the contact surface between the base substrate and the rivet member when filling the glass frit can be reduced by the laminate material, it is possible to prevent the occurrence of cracks in the base substrate. That is, it is possible to form the penetration electrode while reliably maintaining the airtightness in the cavity. Moreover, it is possible to prevent the leakage of the glass frit and the occurrence of cracks in the base substrate and to improve the yield.

DETAILED DESCRIPTION OF THE PREFERRED EMBODIMENTS

Hereinafter, an embodiment of the invention will be described with reference to FIGS. 1 to 27.

Figure 3:
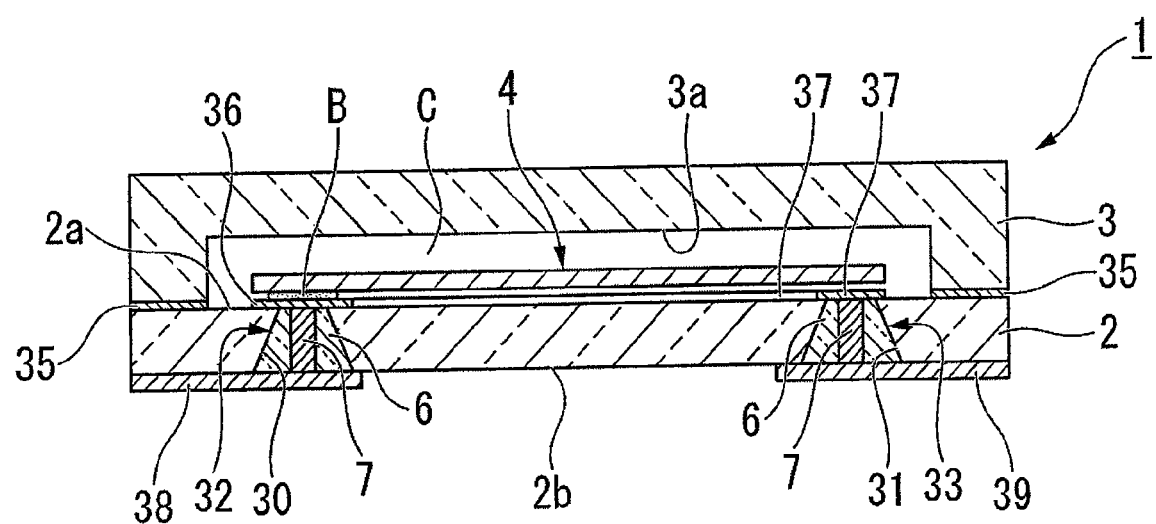
FIG. 3 is a cross-sectional view of the piezoelectric vibrator according to the embodiment of the invention taken along the line A-A shown in FIG. 2.
Figure 4:
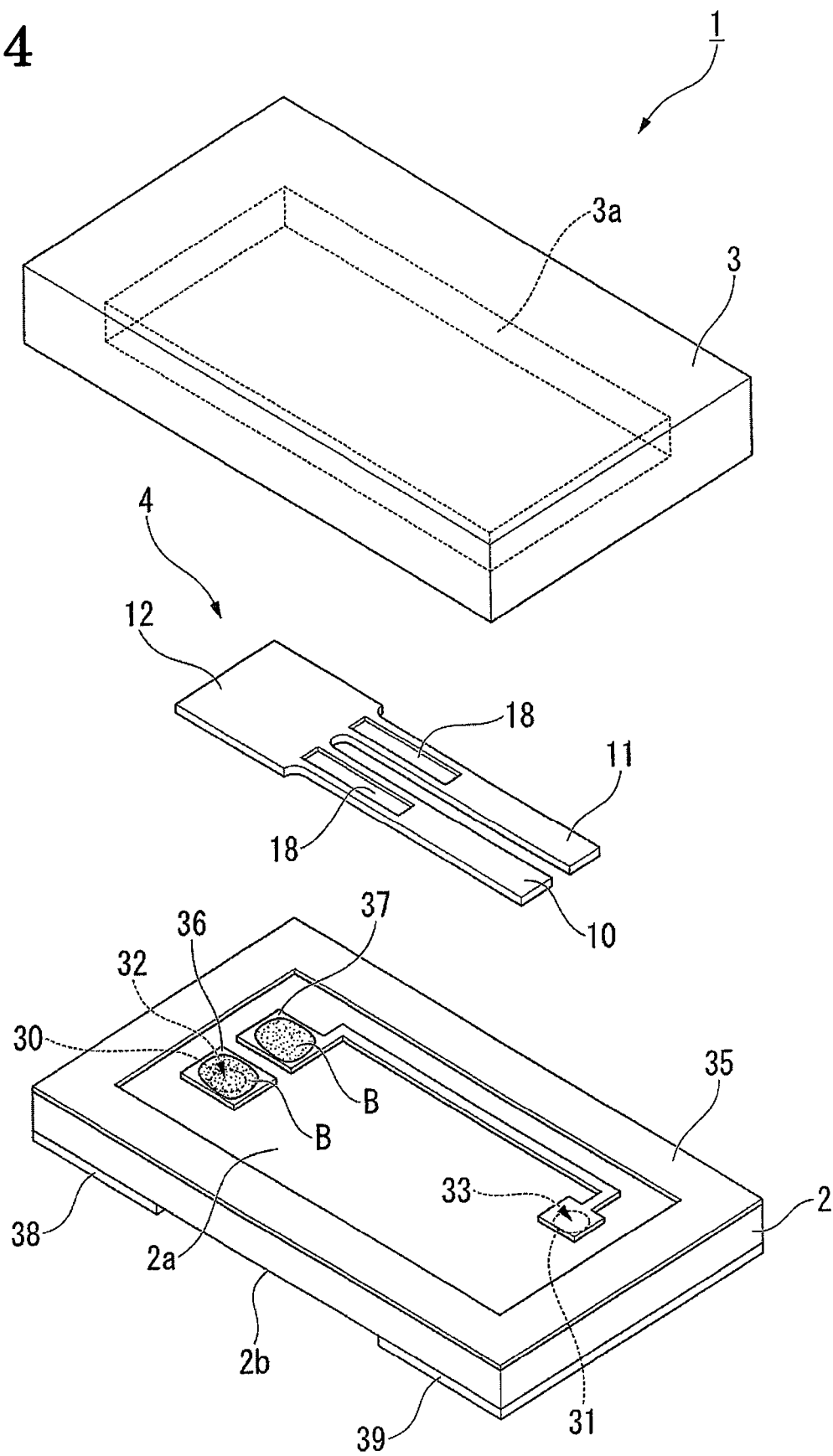
FIG. 4 is an exploded perspective view of the piezoelectric vibrator shown in FIG. 1.

As shown in FIGS. 1 to 4, a piezoelectric vibrator 1 according to the present embodiment is a surface mounted device-type piezoelectric vibrator which is formed in the form of a box laminated in two layers of a base substrate 2 and a lid substrate 3 and in which a piezoelectric vibrating reed 4 is accommodated in a cavity C at an inner portion thereof. In FIG. 4, for better understanding of the drawings, illustrations of the excitation electrode 15, extraction electrodes 19 and 20, mount electrodes 16 and 17, and weight metal film 21 of the piezoelectric vibrating reed 4 are omitted.

Figure 5:
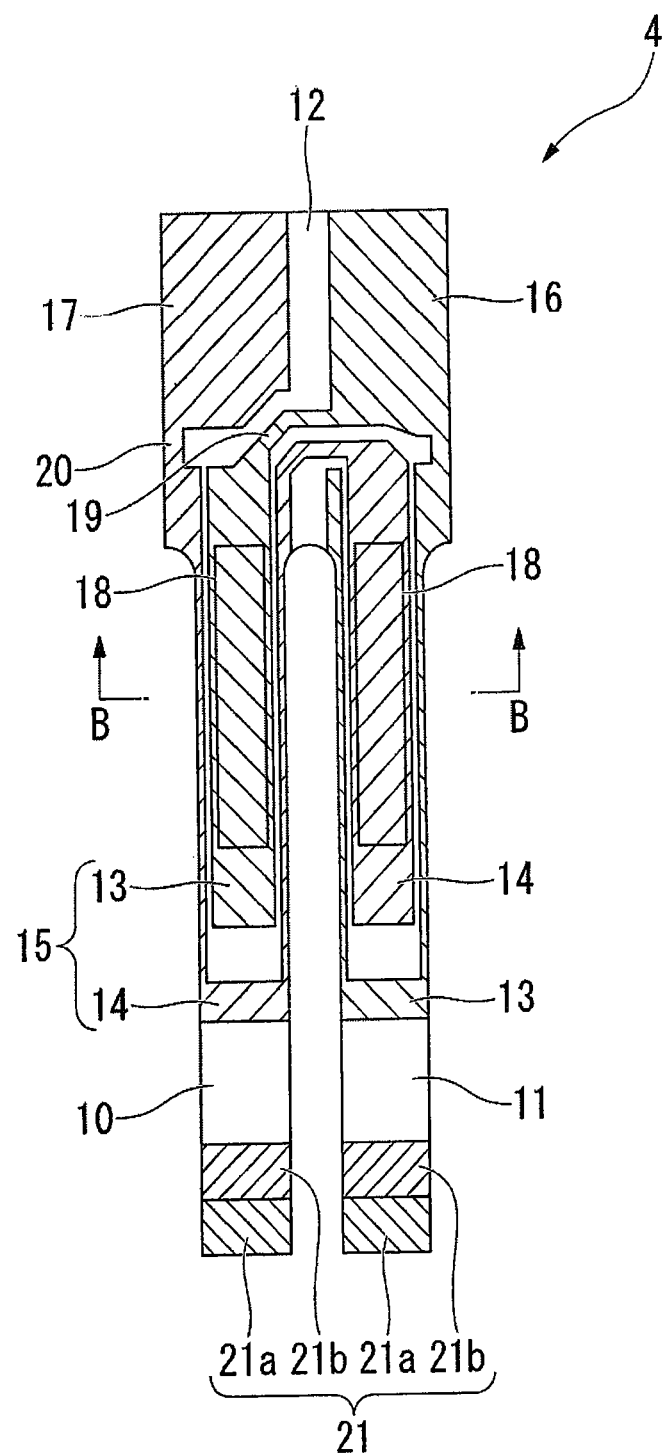
FIG. 5 is a top view of the piezoelectric vibrating reed that constitutes the piezoelectric vibrator shown in FIG. 1.
Figure 6:
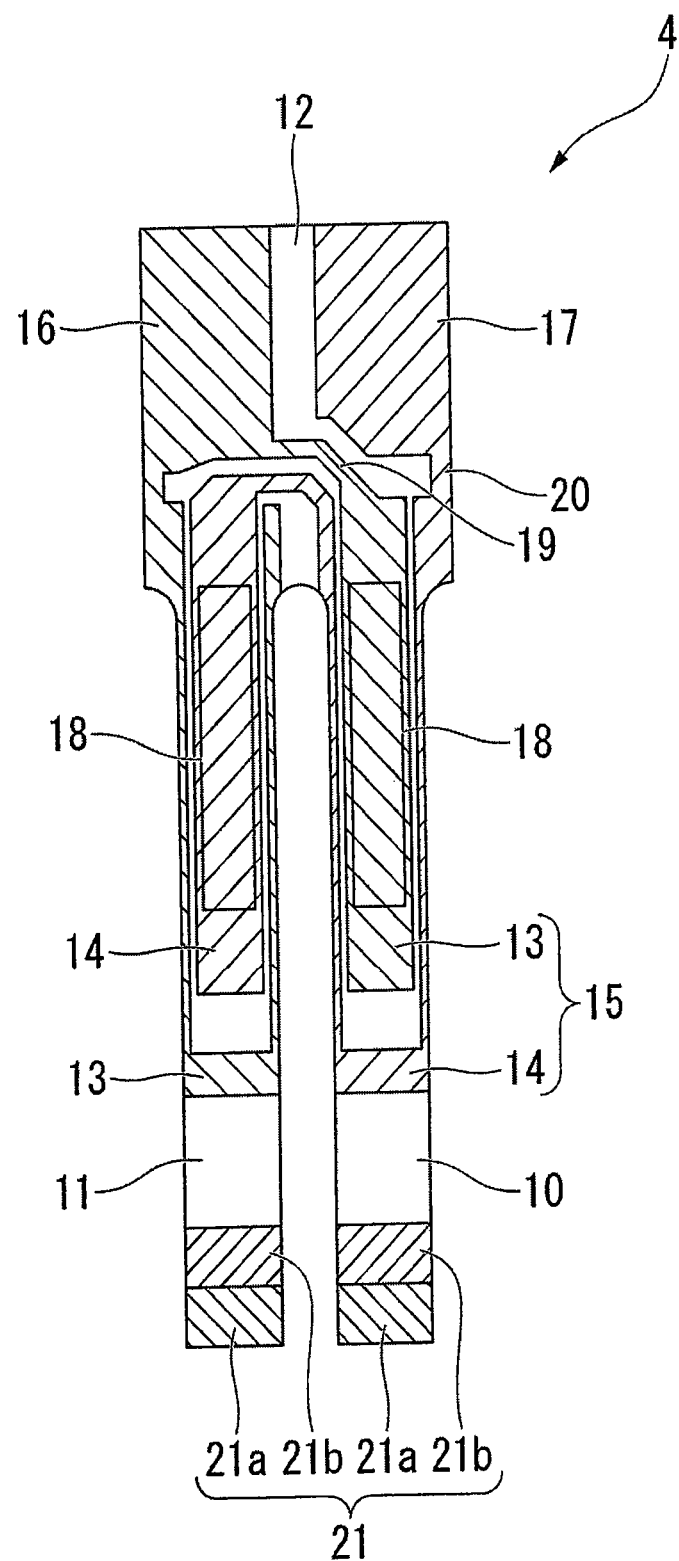
FIG. 6 is a bottom view of the piezoelectric vibrating reed shown in FIG. 5.
Figure 7:
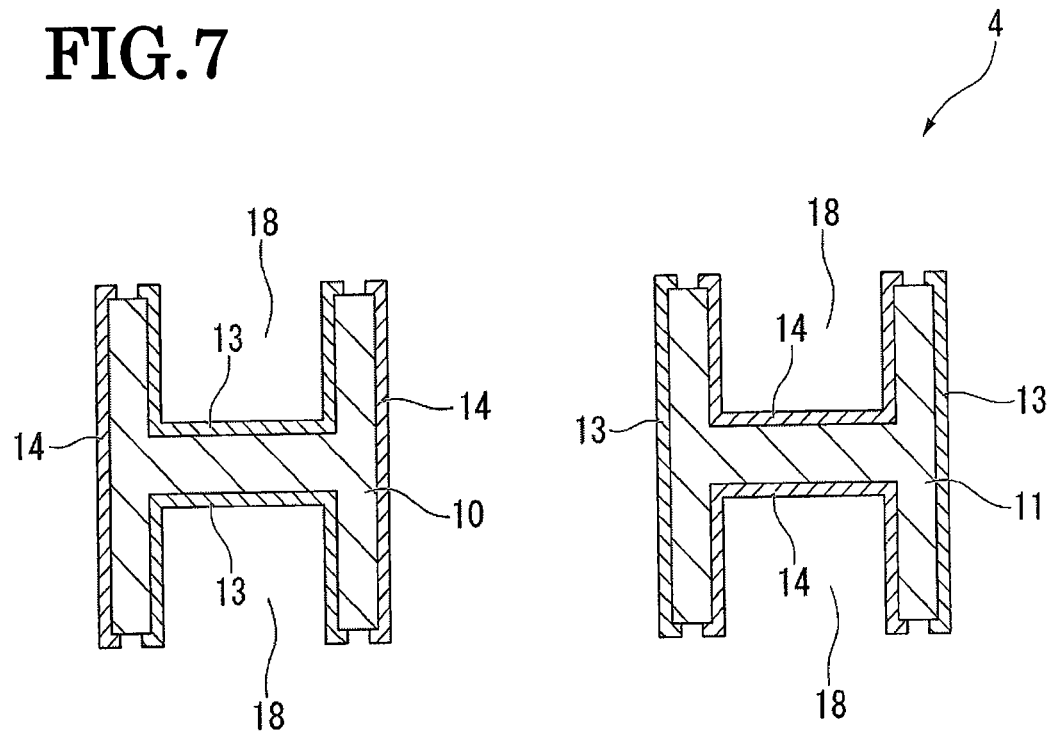
FIG. 7 is a cross-sectional view taken along the line B-B shown in FIG. 5.

As shown in FIGS. 5 to 7, the piezoelectric vibrating reed 4 is a tuning-fork type vibrating reed which is made of a piezoelectric material such as crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the pair of vibrating arms 10 and 11 so as to allow the pair of vibrating arms 10 and 11 to vibrate and includes a first excitation electrode 13 and a second excitation electrode 14; and mount electrodes 16 and 17 which are electrically connected to the first excitation electrode 13 and the second excitation electrode 14, respectively.

In addition, the piezoelectric vibrating reed 4 according to the present embodiment is provided with grooves 18 which are formed on both principal surfaces of the pair of vibrating arms 10 and 11 along the longitudinal direction of the vibrating arms 10 and 11. The grooves 18 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction moving closer to or away from each other and is patterned on the outer surfaces of the pair of vibrating arms 10 and 11 in an electrically isolated state. Specifically, the first excitation electrode 13 is mainly formed on the groove 18 of one vibrating arm 10 and both side surfaces of the other vibrating arm 11. On the other hand, the second excitation electrode 14 is mainly formed on both side surfaces of one vibrating arm 10 and the groove 18 of the other vibrating arm 11.

Moreover, the first excitation electrode 13 and the second excitation electrode 14 are electrically connected to the mount electrodes 16 and 17 via the extraction electrodes 19 and 20, respectively, on both principal surfaces of the base portion 12. Moreover, a voltage is applied to the piezoelectric vibrating reed 4 via the mount electrodes 16 and 17.

In addition, the excitation electrode 15, mount electrodes 16 and 17, and lead-out electrodes 19 and 20 are formed, for example, by a coating of a conductive film formed of chromium (Cr), nickel (Ni), aluminum (Al), titanium (Ti) or the like.

The tip ends of the pair of the vibrating arms 10 and 11 are coated with a weight metal film 21 for performing adjustment (frequency adjustment) of their vibration states in a manner such as to vibrate within a predetermined frequency range. In addition, the weight metal film 21 is divided into a rough tuning film 21a used for tuning the frequency roughly and a fine tuning film 21b used for tuning the frequency finely. By tuning the frequency with the use of the rough tuning film 21a and the fine tuning film 21b, the frequency of the pair of the vibrating arms 10 and 11 can be set to fall within the range of the nominal (target) frequency of the device.

The piezoelectric vibrating reed 4 configured in this way is bump-bonded to the upper surface 2a of the base substrate 2 through bumps B made of gold or the like as shown in FIGS. 3 and 4. More specifically, bump bonding is achieved in a state where the pair of mount electrodes 16 and 17 come into contact with two bumps B, respectively, formed on lead-out electrodes 36 and 37 described later, which are patterned on the upper surface 2a of the base substrate 2. In this way, the piezoelectric vibrating reed 4 is supported in a state of being floated from the upper surface 2a of the base substrate 2, and the mount electrodes 16 and 17 and the lead-out electrodes 36 and 37 are electrically connected to each other.

Figure 1:
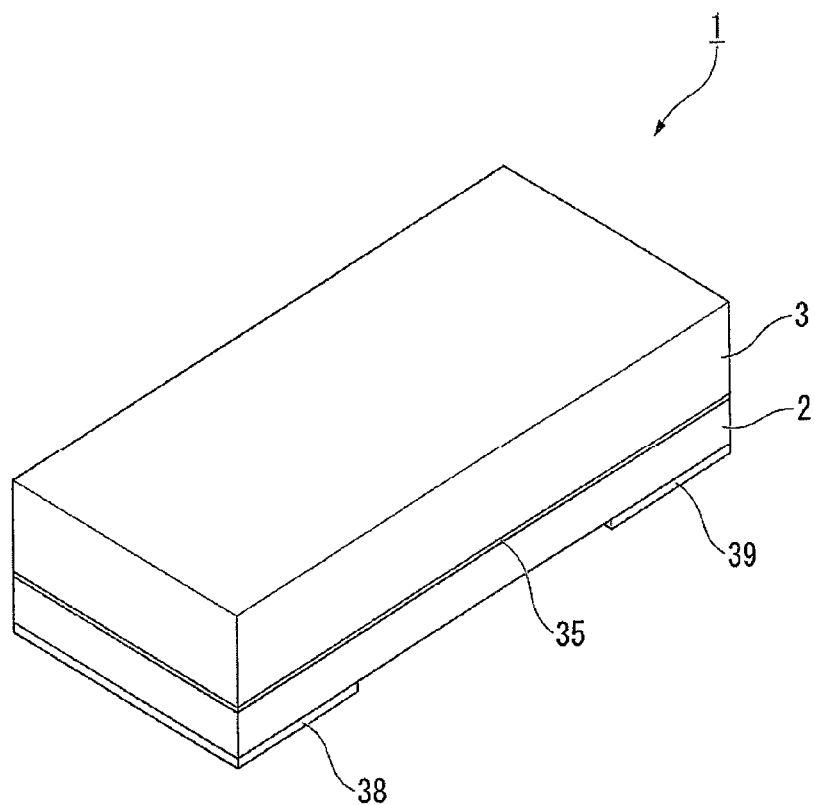
FIG. 1 is a perspective view showing an external appearance of a piezoelectric vibrator according to an embodiment of the invention.
Figure 2:
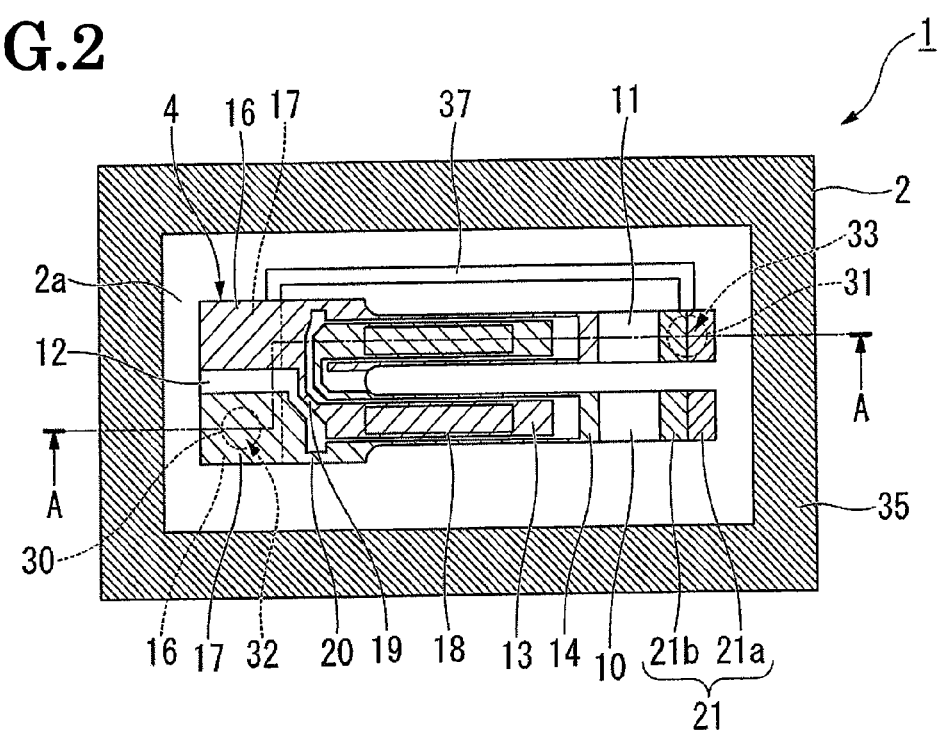
FIG. 2 is a top view showing an inner structure of the piezoelectric vibrator shown in FIG. 1 when a piezoelectric vibrating reed is viewed from above with a lid substrate removed.

The lid substrate 3 is a transparent insulating substrate made of a glass material, for example, soda-lime glass, and is formed in a plate-like shape as shown in FIGS. 1, 3, and 4. Moreover, a bonding surface side thereof to be bonded to the base substrate 2 is formed with a rectangular recess 3a in which the piezoelectric vibrating reed 4 is accommodated.

The recess 3a is a cavity recess serving as the cavity C that accommodates the piezoelectric vibrating reed 4 when the two substrates 2 and 3 are superimposed on each other. Moreover, the lid substrate 3 is anodically bonded to the base substrate 2 in a state where the recess 3a faces the base substrate 2.

The base substrate 2 is a transparent insulating substrate made of a glass material, for example, soda-lime glass, similarly to the lid substrate 3, and is formed in a plate-like shape having a size capable of being overlapped with the lid substrate 3, as shown in FIGS. 1 to 4.

The base substrate 2 is formed with a pair of through holes (penetration holes) 30 and 31 penetrating through the base substrate 2. In this case, the pair of through holes 30 and 31 is formed so as to be received in the cavity C. More specifically, the through holes 30 and 31 of the present embodiment are formed such that one through hole 30 is positioned close to the base portion 12 of the mounted piezoelectric vibrating reed 4, and the other through hole 31 is positioned close to the tip ends of the vibrating arms 10 and 11. The present embodiment is described by way of an example of the through holes which have a tapered sectional shape whose diameter gradually decreases from the lower surface 2b of the base substrate 2 towards the upper surface 2a. However, the invention is not limited to this example, and the through holes may be configured to penetrate straight through the base substrate 2. In any case, they only need to penetrate through the base substrate 2.

The pair of through holes 30 and 31 are formed with a pair of penetration electrodes 32 and 33 which are formed so as to be embedded in the through holes 30 and 31. As shown in FIG. 3, the penetration electrodes 32 and 33 are formed by a cylindrical member 6 and a core portion 7 which are integrally fixed to the through holes 30 and 31 by baking. The penetration electrodes 32 and 33 serve to maintain airtightness in the cavity C by completely blocking the through holes 30 and 31 and achieve electrical connection between the external electrodes 38 and 39 described later and the lead-out electrodes 36 and 37.

Figure 8:
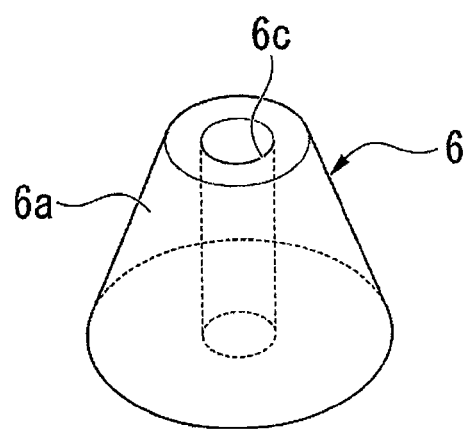
FIG. 8 is a perspective view of a cylindrical member that forms a penetration electrode shown in FIG. 3.

As shown in FIG. 8, the cylindrical member 6 is obtained by baking a paste-like glass frit 6a. In addition, FIG. 8 shows only the cylindrical member 6 which is baked in the through hole. The cylindrical member 6 has a cylindrical shape in which both ends are flat and which has approximately the same thickness as the base substrate 2. A core portion 7 is disposed at the center of the cylindrical member 6 so as to penetrate through the cylindrical member 6. In the present embodiment, the cylindrical member 6 has an approximately conical outer shape (a tapered sectional shape) so as to comply with the shapes of the through holes 30 and 31. As shown in FIG. 3, the cylindrical member 6 is baked in a state of being embedded in the through holes 30 and 31 and is tightly attached to the through holes 30 and 31.

The core portion 7 is a conductive cylindrical core material made of metallic material, and similarly to the cylindrical member 6, has a shape which has flat ends and approximately the same thickness as the base substrate 2. As shown in FIG. 3, when the penetration electrodes 32 and 33 are formed as a finished product, the core portion 7 has approximately the same thickness as the base substrate 2 as described above. However, in the course of the manufacturing process, the length of the core portion 7 is smaller by a distance of 0.02 mm than the thickness of the base substrate 2 in the initial state of the manufacturing process. Moreover, the core portion 7 is positioned at a central hole 6c of the cylindrical member 6, and is tightly attached to the cylindrical member 6 by baking the cylindrical member 6.

The electrical connection of the penetration electrodes 32 and 33 is secured by the conductive core portion 7.

As shown in FIGS. 1 to 4, the upper surface 2a side of the base substrate 2 (the bonding surface side to be bonded to the lid substrate 3) is patterned with a bonding film 35 for anodic bonding and the pair of lead-out electrodes 36 and 37 by a conductive material (for example, aluminum). Among them, the bonding film 35 is formed along the peripheral edge of the base substrate 2 so as to surround the periphery of the recess 3a formed on the lid substrate 3.

Moreover, the pair of lead-out electrodes 36 and 37 are patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4.

More specifically, one lead-out electrode 36 is formed right above the one penetration electrode 32 to be disposed right below the base portion 12 of the piezoelectric vibrating reed 4. Moreover, the other lead-out electrode 37 is formed to be disposed right above the other penetration electrode 33 after being led out from a position near the one lead-out electrode 36 towards the tip ends of the vibrating arms 10 and 11 along the vibrating arms 10 and 11.

The bumps B are formed on the pair of lead-out electrodes 36 and 37, and the piezoelectric vibrating reed 4 is mounted by using the bumps B. In this way, the one mount electrode 16 of the piezoelectric vibrating reed 4 is electrically connected to the one penetration electrode 32 via the one lead-out electrode 36, and the other mount electrode 17 is electrically connected to the other penetration electrode 33 via the other lead-out electrode 37.

Moreover, the lower surface 2b of the base substrate 2 is formed with the external electrodes 38 and 39 which are electrically connected to the pair of penetration electrodes 32 and 33, respectively, as shown in FIGS. 1, 3, and 4. That is, one external electrode 38 is electrically connected to the first excitation electrode 13 of the piezoelectric vibrating reed 4 via the one penetration electrode 32 and the one lead-out electrode 36. In addition, the other external electrode 39 is electrically connected to the second excitation electrode 14 of the piezoelectric vibrating reed 4 via the other penetration electrode 33 and the other lead-out electrode 37.

When the piezoelectric vibrator 1 configured in this manner is operated, a predetermined driving voltage is applied between the pair of external electrodes 38 and 39 formed on the base substrate 2. In this way, a current can be made to flow to the excitation electrode 15 including the first and second excitation electrodes 13 and 14, of the piezoelectric vibrating reed 4, and the pair of vibrating arms 10 and 11 is allowed to vibrate at a predetermined frequency in a direction moving closer to or away from each other. This vibration of the pair of vibrating arms 10 and 11 can be used as the time source, the timing source of a control signal, the reference signal source, and the like.

Next, a method of manufacturing a plurality of the above-described piezoelectric vibrators 1 at once using a base substrate wafer 40 and a lid substrate wafer 50 will be described with reference to the flowchart shown in FIG. 9.

First, a piezoelectric vibrating reed manufacturing step is performed to manufacture the piezoelectric vibrating reed 4 shown in FIGS. 5 to 7 (S10). Specifically, first, a Lambert ore made of crystal is sliced at a predetermined angle to obtain a wafer having a constant thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the mount electrodes 16 and 17, and the weight metal film 21. In this way, a plurality of piezoelectric vibrating reeds 4 can be manufactured.

Moreover, after the piezoelectric vibrating reed 4 is manufactured, rough tuning of a resonance frequency is performed. This rough tuning is achieved by irradiating the rough tuning film 21a of the weight metal film 21 with a laser beam to partially evaporate the rough tuning film 21a, thus changing the weight thereof. In addition, fine tuning of adjusting the resonance frequency more accurately is performed after a mounting step is performed. This will be described later.

Figure 10:
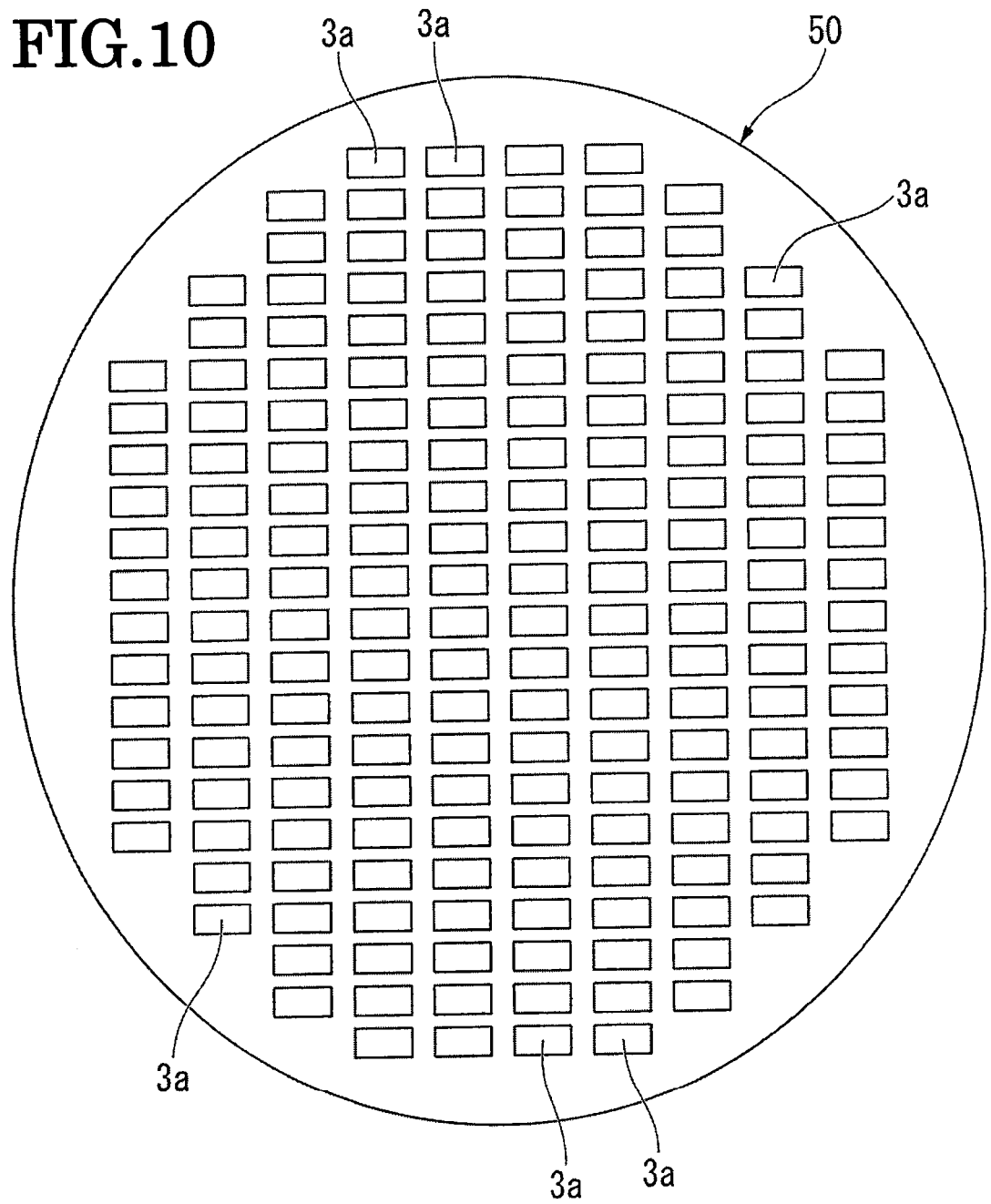
FIG. 10 is a view showing one step of the process of manufacturing the piezoelectric vibrator in accordance with the flowchart shown in FIG. 9, showing a state where a plurality of recesses is formed on a lid substrate wafer serving as a base material of a lid substrate.

Subsequently, a first wafer manufacturing step is performed where the lid substrate wafer 50 later serving as the lid substrate 3 is manufactured up to the stage immediately before anodic bonding is achieved (S20). First, a disk-shaped lid substrate wafer 50 is formed by polishing a piece of soda-lime glass to a predetermined thickness, washing the polished glass, and removing the affected uppermost layer by etching or the like (S21) as shown in FIG. 10. Subsequently, a recess forming step is performed where a plurality of cavity recesses 3a is formed in a matrix form on the bonding surface of the lid substrate wafer 50 by etching, press working, or the like (S22). At this point in time, the first wafer manufacturing step ends.

Subsequently, at the same or a different time as the first wafer manufacturing step, a second wafer manufacturing step is performed where a base substrate wafer 40 later serving as the base substrate 2 is manufactured up to the stage immediately before anodic bonding is achieved (S30). First, a disk-shaped base substrate wafer 40 is formed by polishing a piece of soda-lime glass to a predetermined thickness, washing the polished glass, and removing the affected uppermost layer by etching or the like (S31). Subsequently, a penetration electrode forming step is performed where a plurality of pairs of penetration electrodes 32 and 33 is formed on the base substrate wafer 40 (S30A). Here, the penetration electrode forming step 30A will be described in detail below.

Figure 11:
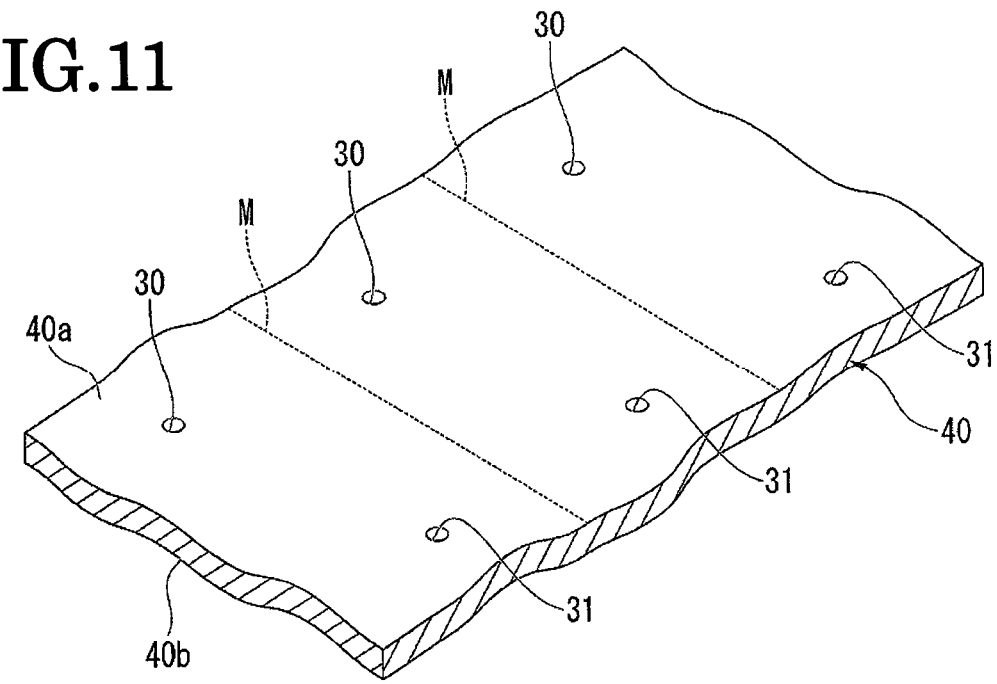
FIG. 11 is a view showing one step of the process of manufacturing the piezoelectric vibrator in accordance with the flowchart shown in FIG. 9, showing a state where a plurality of through holes is formed on a base substrate wafer serving as a base material of a base substrate.
Figure 12:
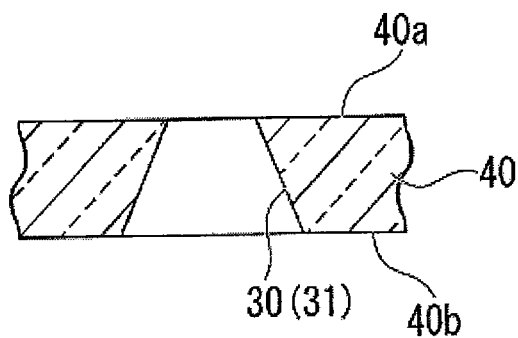
FIG. 12 is a view showing the state shown in FIG. 11 when the state is viewed from the section of the base substrate wafer.

First, as shown in FIG. 11, a penetration hole forming step is performed where a plurality of pairs of through holes 30 and 31 is formed so as to penetrate through the base substrate wafer 40 (S32). The dotted line M shown in FIG. 11 is a cutting line along which a cutting step performed later occurs. When this step is performed, the through holes are formed from the lower surface 40b of the base substrate wafer 40, for example, using a sand blast method. In this way, as shown in FIG. 12, the through holes 30 and 31 having a tapered sectional shape in which the diameter gradually decreases from the lower surface 40b of the base substrate wafer 40 towards the upper surface 40a can be formed. Moreover, a plurality of pairs of through holes 30 and 31 is formed so as to be received in the recesses 3a formed on the lid substrate wafer 50 when the two wafers 40 and 50 are superimposed on each other later. In addition, the through holes are formed so that one through hole 30 is positioned close to the base portion 12 of the piezoelectric vibrating reed 4, and the other through hole 31 is positioned close to the tip end side of the vibrating arms 10 and 11.

Figure 13:
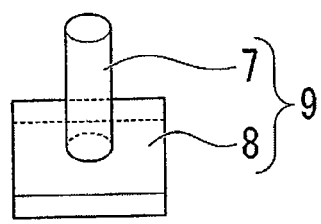
FIG. 13 is a perspective view of a rivet member according to the embodiment of the invention.
Figure 14:
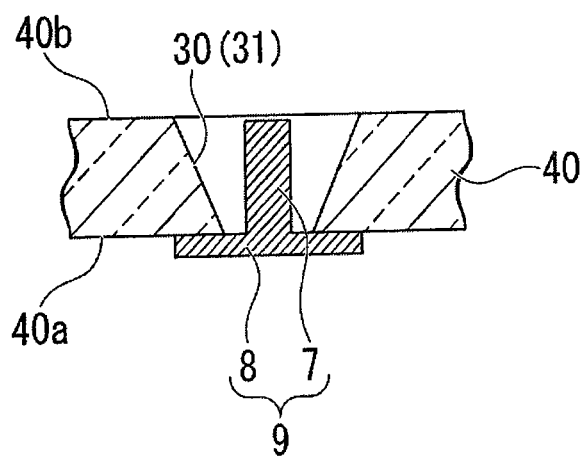
FIG. 14 is a view showing one step of the process of manufacturing the piezoelectric vibrator in accordance with the flowchart shown in FIG. 9, showing a state where a rivet member is disposed in a through hole, subsequent to the state shown in FIG. 12.

Subsequently, a rivet member disposing step is performed where the core portions 7 of the rivet members 9 are disposed in the plurality of through holes 30 and 31 (S33). At this time, as shown in FIG. 13, as the rivet member 9, is used a conductive rivet member 9 which has a planar head portion 8 and a core portion 7 which extends upwardly from the head portion 8 in a direction approximately perpendicular to the surface of the head portion 8 and has a length shorter by a distance of 0.02 mm than the thickness of the base substrate wafer 40 and a flat tip end. As shown in FIG. 14, the core portion 7 is inserted until the head portion 8 of the rivet member 9 comes into contact with the upper surface 40a of the base substrate wafer 40. Here, it is necessary to dispose the rivet member 9 so that the axial direction of the core portion 7 is approximately identical to the axial direction of the through holes 30 and 31. However, since the rivet member 9 having the core portion 7 formed on the head portion 8 is used, it is possible to make the axial direction of the core portion 7 identical to the axial direction of the through holes 30 and 31 by a simple operation of pushing the rivet member 9 until the head portion 8 comes into contact with the upper surface 40a of the base substrate wafer 40. Therefore, it is possible to improve workability during the setting step. Since the head portion 8 has a planar shape, the base substrate wafer 40 can be placed stably on a flat surface of a desk or the like without any rattling during the period between the setting step and a baking step performed later. In this respect, it is possible to achieve an improvement in the workability.

Figure 15:
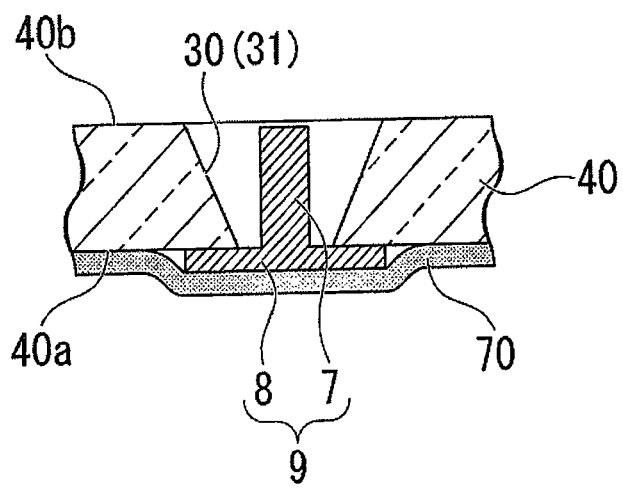
FIG. 15 is a view showing one step of the process of manufacturing the piezoelectric vibrator in accordance with the flowchart shown in FIG. 9, showing a state where a laminate material is attached, subsequent to the state shown in FIG. 14.

Subsequently, as shown in FIG. 15, a laminate material attaching step (S34) is performed where a laminate material 70 is attached to the upper surface 40a of the base substrate wafer 40 so as to cover the head portion 8 of the rivet member 9. The laminate material 70 is attached on approximately the entire surface of the upper surface 40a of the base substrate wafer 40. The laminate material 70 used herein is, for example, a material in which a thermoplastic adhesive made of acryl or the like is applied on a tape body made of sheet, and which has a thickness of 50 μm or more and 200 μm or less. By using the laminate material 70, it is possible to hold the rivet member 9 without forming any gap between the upper surface 40a of the base substrate wafer 40 and the head portion 8 of the rivet member 9. That is, by bringing the head portion 8 into contact with the upper surface 40a of the base substrate wafer 40, it is possible to reliably fill the paste-like glass frit 6a in the through holes 30 and 31.

Figure 16:
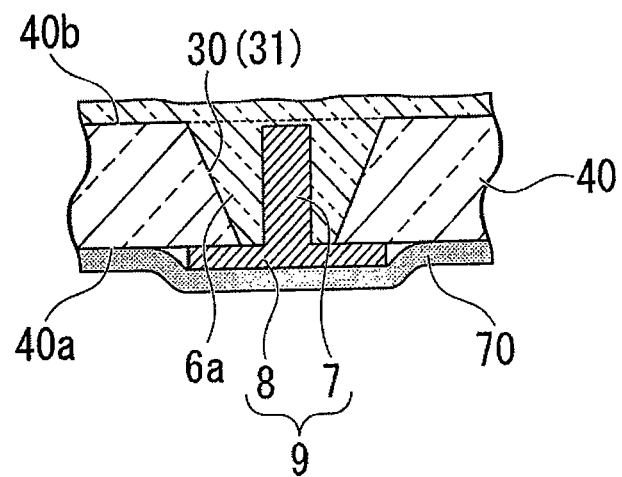
FIG. 16 is a view showing one step of the process of manufacturing the piezoelectric vibrator in accordance with the flowchart shown in FIG. 9, showing a state where a glass frit is filled in the through hole, subsequent to the state shown in FIG. 15.

Subsequently, as shown in FIG. 16, a glass frit filling step is performed where the paste-like glass frit 6a made of a glass material is filled in the through holes 30 and 31 in a state where the laminate material 70 is attached to the upper surface 40a of the base substrate wafer 40 (S35). In order to fill the glass frit 6a in the through holes 30 and 31, the glass frit 6a is filled from the side of the through holes 30 and 31 close to the lower surface 40b of the base substrate wafer 40. At this time, a sufficient amount of the glass frit 6a is applied so that the glass frit 6a is securely filled in the through holes 30 and 31. Therefore, the glass frit 6a is also applied onto the lower surface 40b of the base substrate wafer 40. If the glass frit 6a is baked in this state, since a subsequent polishing step may take a lot of time, a glass frit removal step is performed so as to remove the redundant glass frit 6a before baking (S36).

Figure 17:
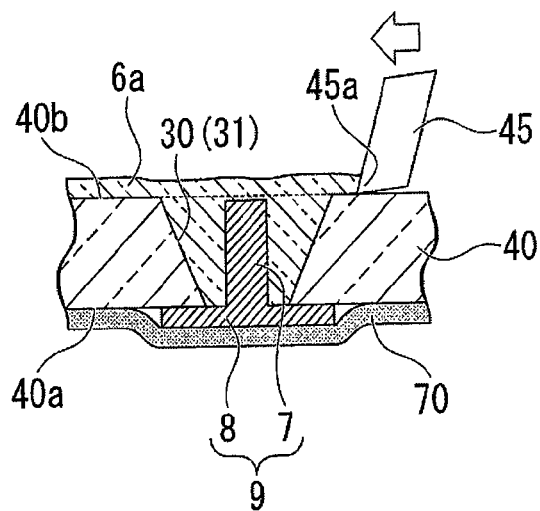
FIG. 17 is a view showing one step of the process of manufacturing the piezoelectric vibrator in accordance with the flowchart shown in FIG. 9, showing a state where a redundant glass frit is removed, subsequent to the state shown in FIG. 16.
Figure 18:
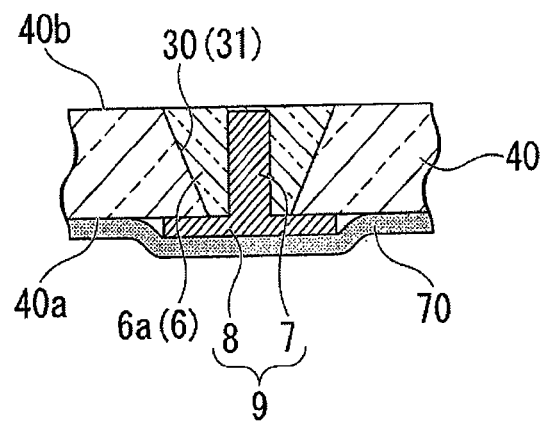
FIG. 18 is a view showing one step of the process of manufacturing the piezoelectric vibrator in accordance with the flowchart shown in FIG. 9, showing a state where a paste is baked and cured, subsequent to the state shown in FIG. 17.

As shown in FIG. 17, in the glass frit removal step, the glass frit 6a protruding from the through holes 30 and 31 is removed by moving a squeegee 45 made of resin, for example, along the surface of the base substrate wafer 40 with a tip end 45a of the squeegee 45 coming into contact with the surface of the base substrate wafer 40. By doing so, as shown in FIG. 18, the redundant glass frit 6a can be removed securely by a simple operation. In the present embodiment, the length of the core portion 7 of the rivet member 9 is smaller by a distance of 0.02 mm than the thickness of the base substrate wafer 40. Therefore, when the squeegee 45 passes over the through holes 30 and 31, the tip end 45a of the squeegee 45 will not make contact with the tip end of the core portion 7. Thus, it is possible to prevent the core portion 7 from being tilted.

Subsequently, a baking step is performed where the glass frit 6a filled in the through holes 30 and 31 is baked at a predetermined temperature (S37). Through the baking step, the through holes 30 and 31, the glass frit 6a embedded in the through holes 30 and 31, and the rivet members 9 disposed in the glass frit 6a are attached to each other. Since baking is performed for each head portion 8, the through holes 30 and 31 and the rivet members 9 can be integrally fixed to each other in a state where the axial direction of the core portion 7 is approximately identical to the axial direction of the through holes 30 and 31. The baked glass frit 6a is solidified as the cylindrical member 6. Moreover, at the same time, since baking is performed in a state where the laminate material 70 is attached, the adhesion force of the thermoplastic adhesive applied on the laminate material 70 decreases.

Figure 19:
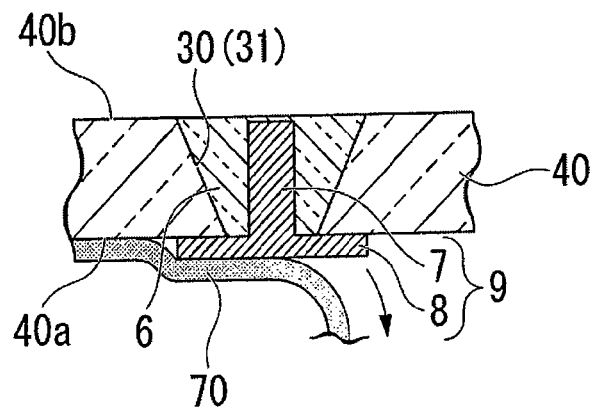
FIG. 19 is a view showing one step of the process of manufacturing the piezoelectric vibrator in accordance with the flowchart shown in FIG. 9, showing a state where the laminate material is separated, subsequent to the state shown in FIG. 18.

Subsequently, as shown in FIG. 19, a laminate material separation step is performed where the laminate material 70 is separated from the upper surface 40a of the base substrate wafer 40 (S38). As described above, since the adhesive force of the thermoplastic adhesive applied on the laminate material 70 decreases in the baking step S37, it is possible to easily separate the laminate material 70.

Figure 20:
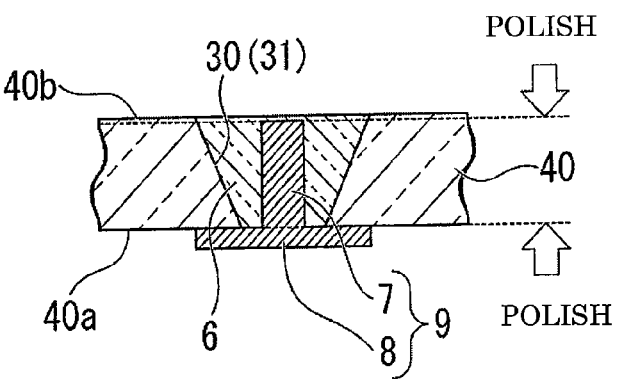
FIG. 20 is a view showing one step of the process of manufacturing the piezoelectric vibrator in accordance with the flowchart shown in FIG. 9, showing a state where the head portion of the rivet member and the surface of the base substrate wafer are polished, subsequent to the state shown in FIG. 19.

Subsequently, as shown in FIG. 20, a polishing step is performed where the head portions 8 of the rivet members 9 are polished and removed (S39). In this way, it is possible to remove the head portions 8 that achieved positioning of the cylindrical member 6 and the core portions 7 and allow only the core portions 7 to remain inside the cylindrical member 6.

Figure 21:
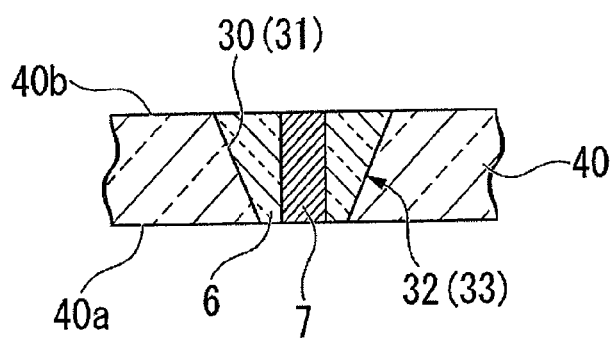
FIG. 21 is a view showing one step of the process of manufacturing the piezoelectric vibrator in accordance with the flowchart shown in FIG. 9, showing a state where a penetration electrode forming step is finished.

At the same time, the lower surface 40b of the base substrate wafer 40 is polished to obtain a flat surface. The polishing is continued until the tip end of the core portion 7 is exposed. As a result, as shown in FIG. 21, it is possible to obtain a plurality of pairs of penetration electrodes 32 and 33 in which the cylindrical member 6 and the core portion 7 are integrally fixed.

As described above, the surfaces (the upper and lower surfaces 40a and 40b) of the base substrate wafer 40 are approximately flush with both ends of the cylindrical member 6 and the core portion 7. That is, it is possible to make the surfaces of the base substrate wafer 40 approximately flush with the surfaces of the penetration electrodes 32 and 33. The penetration electrode forming step S30A ends at the point in time when the polishing step is performed.

Figure 22:
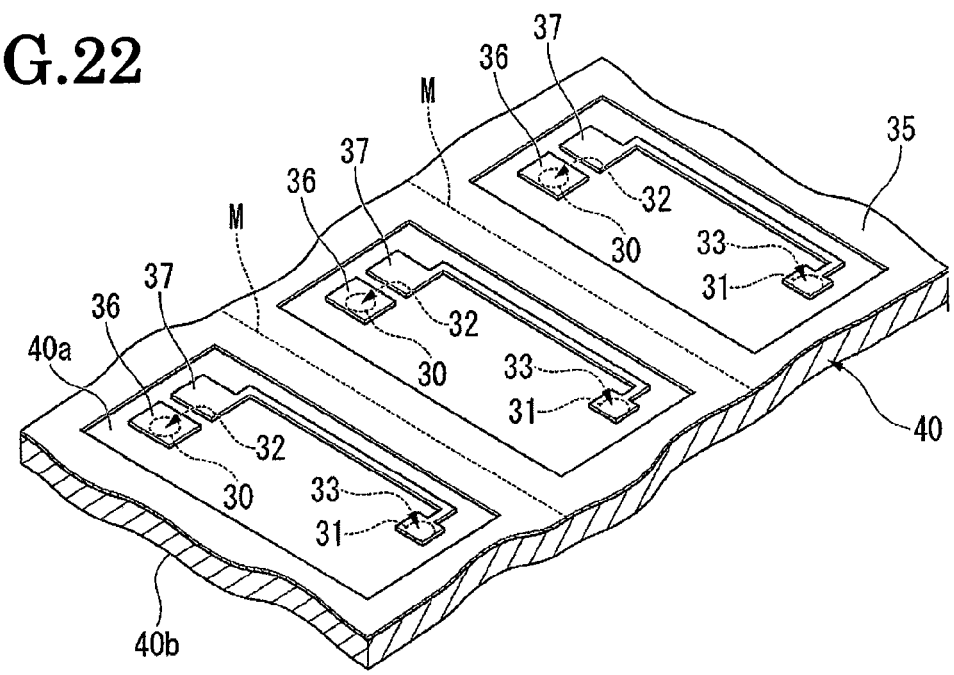
FIG. 22 is a view showing one step of the process of manufacturing the piezoelectric vibrator in accordance with the flowchart shown in FIG. 9, showing a state where a bonding film and a lead-out electrode are patterned on the upper surface of the base substrate wafer, subsequent to the state shown in FIG. 21.
Figure 23:
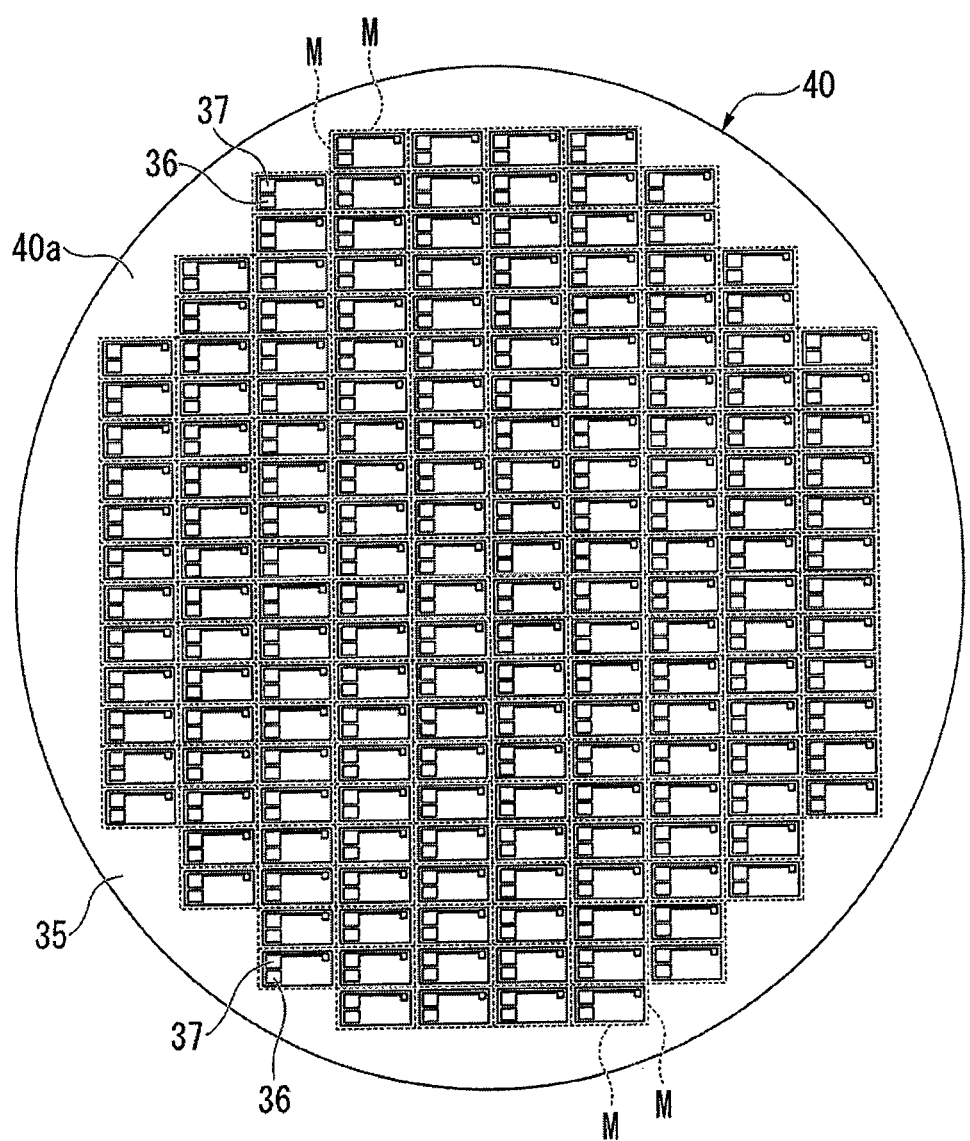
FIG. 23 is an overall view of the base substrate wafer in the state shown in FIG. 22.

Subsequently, a bonding film forming step is performed where a conductive material is patterned on the upper surface 40a of the base substrate wafer 40 so as to form a bonding film 35 as shown in FIGS. 22 and 23 (S40). Moreover, a lead-out electrode forming step is performed where a plurality of lead-out electrodes 36 and 37 is formed so as to be electrically connected to each pair of penetration electrodes 32 and 33, respectively (S41). The dotted line M shown in FIGS. 22 and 23 is a cutting line along which a cutting step performed later occurs.

Particularly, as described above, the penetration electrodes 32 and 33 are approximately flush with the upper surface 40a of the base substrate wafer 40. Therefore, the lead-out electrodes 36 and 37 which are patterned on the upper surface 40a of the base substrate wafer 40 are closely adhered to the penetration electrodes 32 and 33 without forming any gap or the like therebetween. In this way, it is possible to achieve a reliable electrical connection between the one lead-out electrode 36 and the one penetration electrode 32 and a reliable electrical connection between the other lead-out electrode 37 and the other penetration electrode 33. At this point in time, the second wafer manufacturing step ends.

Figure 9:
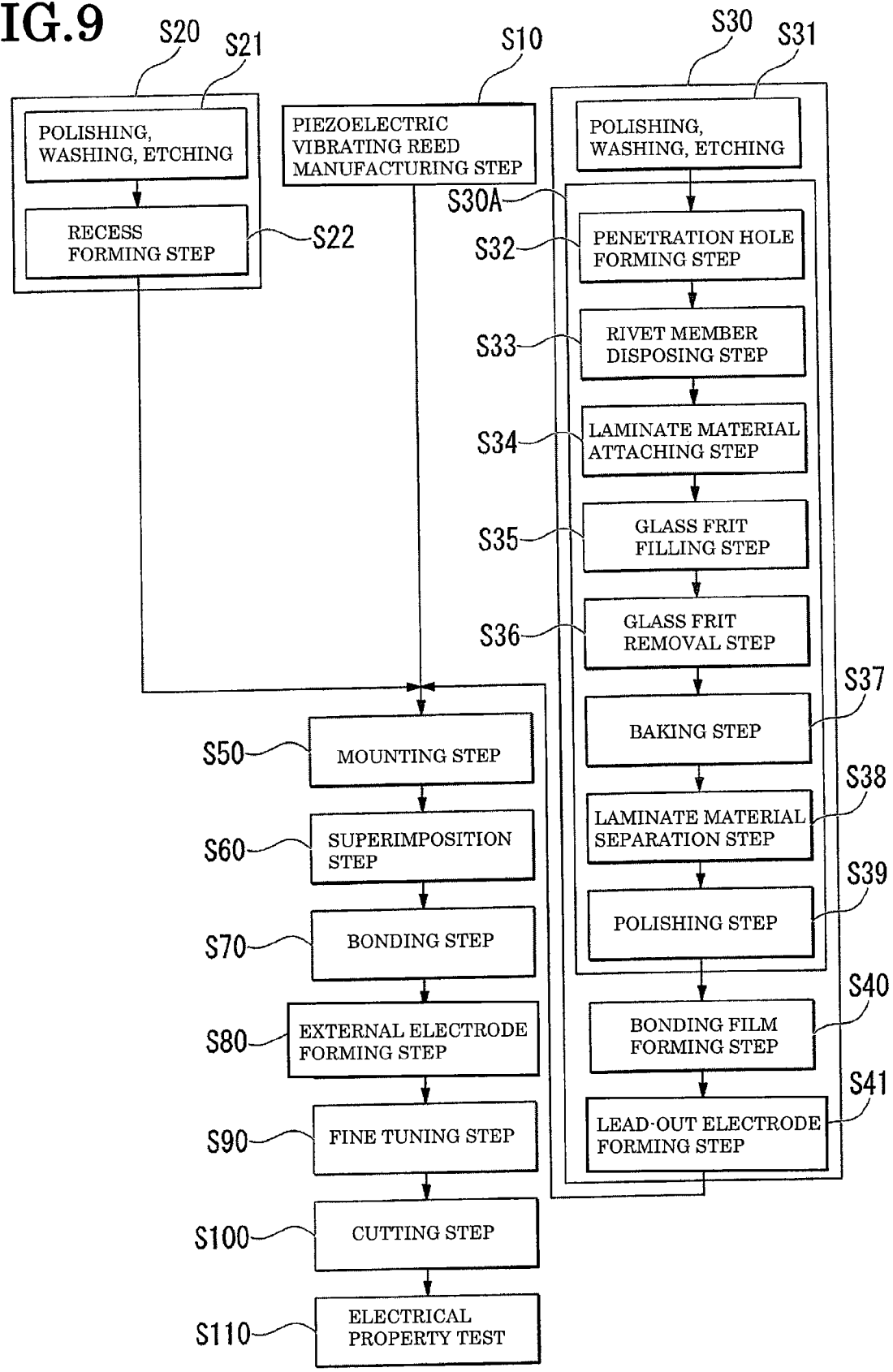
FIG. 9 is a flowchart showing the flow of the process of manufacturing the piezoelectric vibrator shown in FIG. 1.

In FIG. 9, although the lead-out electrode forming step (S41) is performed after the bonding film forming step (S40), conversely, the bonding film forming step (S40) may be performed after the lead-out electrode forming step (S41), and the two steps may be performed at the same time. The same operational effect can be obtained with any order of the steps. Therefore, the order of the steps may be appropriately changed as necessary.

Subsequently, a mounting step is performed where a plurality of manufactured piezoelectric vibrating reeds 4 is bonded to the upper surface 40a of the base substrate wafer 40 with the lead-out electrodes 36 and 37 disposed therebetween (S50). First, bumps B made of gold or the like are formed on the pair of lead-out electrodes 36 and 37. The base portion 12 of the piezoelectric vibrating reed 4 is placed on the bumps B, and thereafter the piezoelectric vibrating reed 4 is pressed against the bumps B while heating the bumps B to a predetermined temperature. In this way, the piezoelectric vibrating reed 4 is mechanically supported by the bumps B, and the mount electrodes 16 and 17 are electrically connected to the lead-out electrodes 36 and 37. Therefore, at this point, the pair of excitation electrodes 15 of the piezoelectric vibrating reed 4 are electrically connected to the pair of penetration electrodes 32 and 33, respectively.

Particularly, since the piezoelectric vibrating reed 4 is bump-bonded, the piezoelectric vibrating reed 4 is supported in a state of being floated from the upper surface 40a of the base substrate wafer 40.

After the piezoelectric vibrating reed 4 is mounted, a superimposition step is performed where the lid substrate wafer 50 is superimposed on the base substrate wafer 40 (S60). Specifically, both wafers 40 and 50 are aligned at a correct position using reference marks or the like not shown in the figure as indices. In this way, the mounted piezoelectric vibrating reed 4 is accommodated in the recess 3a formed on the base substrate wafer 40, namely in the cavity C which is surrounded by the two wafers 40 and 50.

Figure 24:
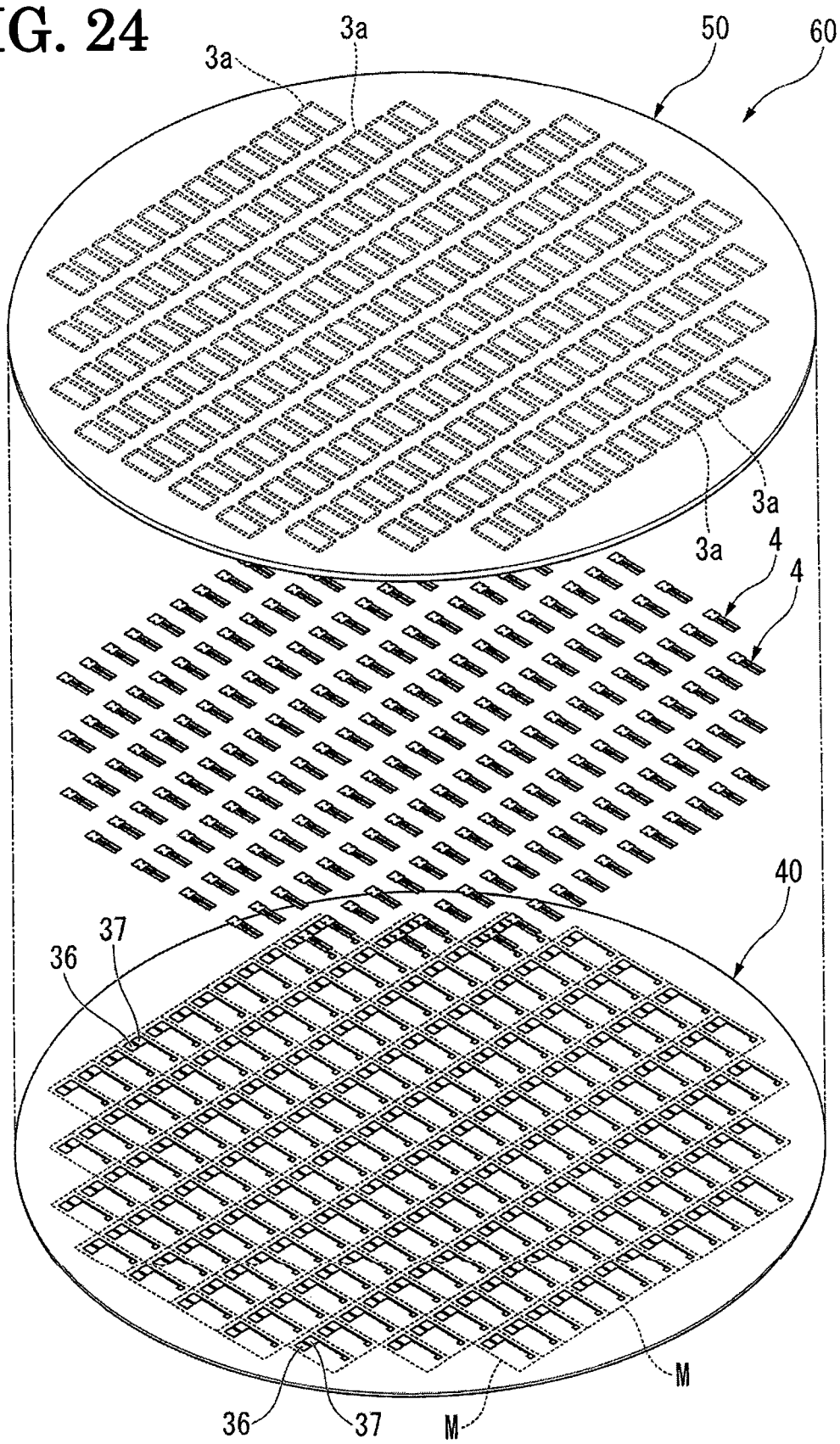
FIG. 24 is a view showing one step of the process of manufacturing the piezoelectric vibrator in accordance with the flowchart shown in FIG. 9 and is an exploded perspective view of a wafer assembly in which the base substrate wafer and the lid substrate wafer are anodically bonded with the piezoelectric vibrating reed accommodated in the cavity.

After the superimposition step is performed, a bonding step is performed where the two superimposed wafers 40 and 50 are inserted into an anodic bonding machine (not shown) to achieve anodic bonding under a predetermined temperature atmosphere with application of a predetermined voltage (S70). Specifically, a predetermined voltage is applied between the bonding film 35 and the lid substrate wafer 50. Then, an electrochemical reaction occurs at the interface between the bonding film 35 and the lid substrate wafer 50, whereby they are strengthened and tightly adhered and anodically bonded. In this way, the piezoelectric vibrating reed 4 can be sealed in the cavity C, and a wafer assembly 60 shown in FIG. 24 can be obtained in which the base substrate wafer 40 and the lid substrate wafer 50 are bonded to each other. In FIG. 24, for better understanding of the figure, the wafer assembly 60 is illustrated in an exploded state, and illustration of the bonding film 35 is omitted from the base substrate wafer 40. The dotted line M shown in FIG. 24 is a cutting line along which a cutting step performed later occurs.

When the anodic bonding is performed, since the through holes 30 and 31 formed on the base substrate wafer 40 are completely blocked by the penetration electrodes 32 and 33, the airtightness in the cavity C will not be impaired by the through holes 30 and 31. In particular, since the cylindrical member 6 and the core portion 7 are integrally fixed by baking, and they are tightly attached to the through holes 30 and 31, it is possible to reliably maintain airtightness in the cavity C.

After the above-described anodic bonding is completed, an external electrode forming step is performed where a conductive material is patterned onto the lower surface 40b of the base substrate wafer 40 so as to form a plurality of pairs of external electrodes 38 and 39 which is electrically connected to the pair of penetration electrodes 32 and 33 (S80). Through this step, the piezoelectric vibrating reed 4 which is sealed in the cavity C can be operated using the external electrodes 38 and 39.

In particular, when this step is performed, similarly to the step of forming the lead-out electrodes 36 and 37, since the penetration electrodes 32 and 33 are approximately flush with the lower surface 40b of the base substrate wafer 40, the patterned external electrodes 38 and 39 are closely adhered onto the penetration electrodes 32 and 33 without forming any gap or the like therebetween. In this way, it is possible to achieve a reliable electrical connection between the external electrodes 38 and 39 and the penetration electrodes 32 and 33.

Subsequently, a fine tuning step is performed on the wafer assembly 60 where the frequencies of the individual piezoelectric vibrators 1 sealed in the cavities C are tuned finely to fall within a predetermined range (S90). Specifically, a voltage is applied to the pair of external electrodes 38 and 39 which are formed on the lower surface 40b of the base substrate wafer 40, thus allowing the piezoelectric vibrating reeds 4 to vibrate. A laser beam is irradiated onto the lid substrate wafer 50 from the outer side while measuring the vibration frequencies to evaporate the fine tuning film 21b of the weight metal film 21. In this way, since the weight on the tip end sides of the pair of vibrating arms 10 and 11 is changed, the fine tuning can be performed in such a way that the frequency of the piezoelectric vibrating reed 4 falls within the predetermined range of the nominal frequency.

After the fine tuning of the frequency is completed, a cutting step is performed where the bonded wafer assembly 60 is cut along the cutting line M shown in FIG. 24 to obtain small fragments (S100). As a result, a plurality of two-layered surface mounted device-type piezoelectric vibrators 1 shown in FIG. 1, in which the piezoelectric vibrating reed 4 is sealed in the cavity C formed between the base substrate 2 and the lid substrate 3 being anodically bonded together, can be manufactured at once.

The fine tuning step (S90) may be performed after performing the cutting step (S100) to obtain the individual fragmented piezoelectric vibrators 1. However, as described above, by performing the fine tuning step (S90) earlier, since the fine tuning step can be performed on the wafer assembly 60, it is possible to perform the fine tuning on the plurality of piezoelectric vibrators 1 more efficiently. Therefore, it is desirable because throughput can be increased.

Subsequently, an internal electrical property test is conducted (S110). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are compared and checked as well. Finally, an external appearance test of the piezoelectric vibrator 1 is conducted to check the dimensions, the quality, and the like. In this way, the manufacturing of the piezoelectric vibrator 1 ends.

According to the present embodiment, when forming the penetration electrodes 32 and 33 on the base substrate wafer 40 (the base substrate 2), the glass frit 6a is filled in the through holes 30 and 31 in a state where the laminate material 70 is attached to the base substrate wafer 40 so as to cover the head portion 8 of the rivet member 9. Therefore, the rivet member 9 and the base substrate wafer 40 are held by the laminate material 70, and it is possible to prevent the rivet member 9 from falling off from the base substrate wafer 40 when filling the glass frit 6a. Moreover, since the base substrate wafer 40 and the rivet member 9 can be held by the laminate material 70 without any gap, it is possible to prevent leakage of the glass frit 6a. Furthermore, since the load applied to the contact surface between the base substrate wafer 40 and the rivet member 9 when filling the glass frit 6a can be absorbed and reduced by the laminate material 70, it is possible to prevent the occurrence of cracks in the base substrate wafer 40. That is, it is possible to form the penetration electrodes 32 and 33 while reliably maintaining the airtightness in the cavity C. Moreover, it is possible to prevent the leakage of the glass frit 6a and the occurrence of cracks in the base substrate wafer 40 and to improve the yield.

Moreover, the laminate material 70 includes the tape body formed of sheet and the thermoplastic adhesive applied on the tape body, and the laminate material 70 is separated after the step of baking and curing the glass frit 6a. Thus, it is possible to bake and cure the glass frit 6a and to decrease the adhesion force of the thermoplastic adhesive. Therefore, when the laminate material 70 is separated after the step of baking the glass frit 6a, it is possible to easily separate the laminate material 70 from the upper surface 40a of the base substrate wafer 40 and the head portion 8 of the rivet member 9 and to improve production efficiency. Moreover, it is possible to securely separate the laminate material 70.

Moreover, since the thickness of the laminate material 70 is 50 μm or more and 200 μm or less, it is possible to obtain cushioning properties appropriate for the laminate material 70 and to prevent the occurrence of cracks in the base substrate wafer 40 when filling the glass frit 6a in the through holes 30 and 31. In addition, if the laminate material 70 is too thin, since it is not possible to obtain appropriate cushioning properties, there is a possibility that a crack is formed in the base substrate wafer 40. Conversely, if the laminate material 70 is too thick, the cushioning properties increase too much, there is a possibility that a load is applied to the contact portion between the base substrate wafer 40 and the rivet member 9, and a crack is formed in the base substrate wafer 40.

(Oscillator)

Next, an oscillator according to an embodiment of the invention will be described with reference to FIG. 25.

Figure 25:
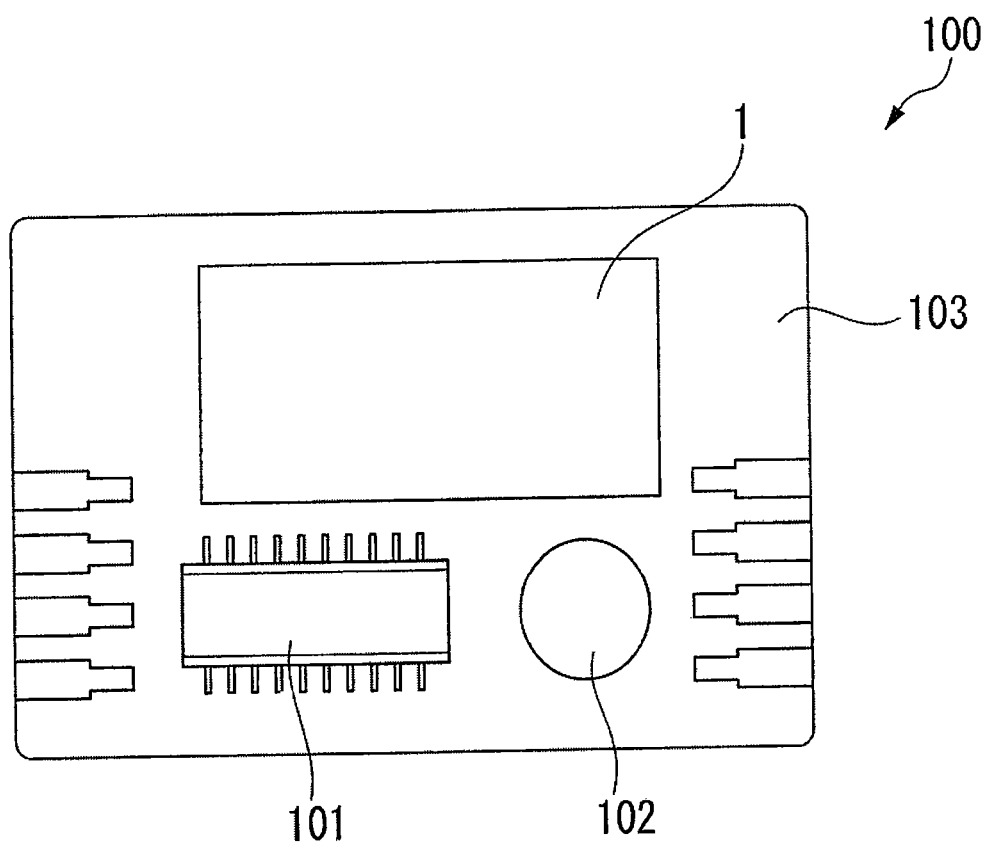
FIG. 25 is a view showing the configuration of an oscillator according to an embodiment of the invention.

In an oscillator 100 according to the present embodiment, the piezoelectric vibrator 1 is used as an oscillating piece electrically connected to an integrated circuit 101, as shown in FIG. 25. The oscillator 100 includes a substrate 103 on which an electronic component 102, such as a capacitor, is mounted. The integrated circuit 101 for an oscillator is mounted on the substrate 103, and the piezoelectric vibrator 1 is mounted near the integrated circuit 101. The electronic component 102, the integrated circuit 101, and the piezoelectric vibrator 1 are electrically connected to each other by a wiring pattern (not shown). In addition, each of the constituent components is molded with a resin (not shown).

In the oscillator 100 configured as described above, when a voltage is applied to the piezoelectric vibrator 1, the piezoelectric vibrating reed 4 in the piezoelectric vibrator 1 vibrates. This vibration is converted into an electrical signal due to the piezoelectric property of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

Moreover, by selectively setting the configuration of the integrated circuit 101, for example, an RTC (Real Time Clock) module, according to demand, it is possible to add a function of controlling the operation date or time of the corresponding device or an external device or of providing the time or calendar in addition to a single functional oscillator for a clock.

As described above, since the oscillator 100 according to the present embodiment includes the high-quality piezoelectric vibrator 1 in which reliable airtightness in the cavity C is secured, and the yield is improved, it is possible to achieve an improvement in the operational reliability and high quality of the oscillator 100 itself which provides stable electrical connection. In addition to this, it is possible to obtain a highly accurate frequency signal which is stable over a long period of time.

(Electronic Device)

Figure 26:
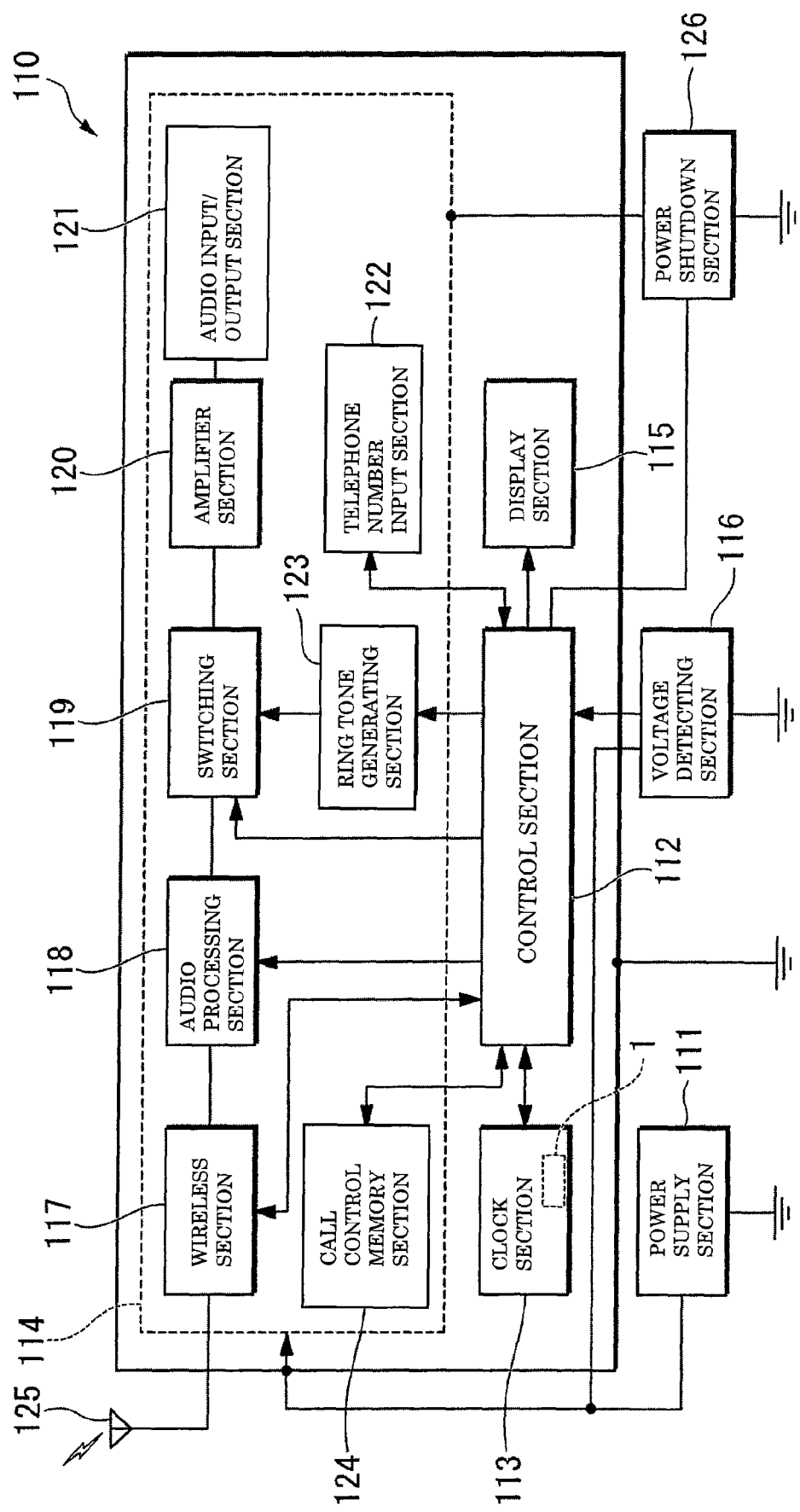
FIG. 26 is a view showing the configuration of an electronic device according to an embodiment of the invention.

Next, an electronic device according to an embodiment of the invention will be described with reference to FIG. 26. In addition, a mobile information device 110 including the piezoelectric vibrator 1 will be described as an example of an electronic device.

The mobile information device 110 according to the present embodiment is represented by a mobile phone, for example, and has been developed and improved from a wristwatch in the related art. The mobile information device 110 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the mobile information device 110 is very small and light compared with a mobile phone in the related art.

Next, the configuration of the mobile information device 110 according to the present embodiment will be described. As shown in FIG. 26, the mobile information device 110 includes the piezoelectric vibrator 1 and a power supply section 111 for supplying power. The power supply section 111 is formed of a lithium secondary battery, for example. A control section 112 which performs various kinds of control, a clock section 113 which performs counting of time and the like, a communication section 114 which performs communication with the outside, a display section 115 which displays various kinds of information, and a voltage detecting section 116 which detects the voltage of each functional section are connected in parallel to the power supply section 111. In addition, the power supply section 111 supplies power to each functional section.

The control section 112 controls an operation of the entire system. For example, the control section 112 controls each functional section to transmit and receive the audio data or to measure or display a current time. In addition, the control section 112 includes a ROM in which a program is written in advance, a CPU which reads and executes a program written in the ROM, a RAM used as a work area of the CPU, and the like.

The clock section 113 includes an integrated circuit, which has an oscillation circuit, a register circuit, a counter circuit, and an interface circuit therein, and the piezoelectric vibrator 1. When a voltage is applied to the piezoelectric vibrator 1, the piezoelectric vibrating reed 4 vibrates, and this vibration is converted into an electrical signal due to the piezoelectric property of crystal and is then input to the oscillation circuit as the electrical signal. The output of the oscillation circuit is binarized to be counted by the register circuit and the counter circuit. Then, a signal is transmitted to or received from the control section 112 through the interface circuit, and current time, current date, calendar information, and the like are displayed on the display section 115.

The communication section 114 has the same function as a mobile phone in the related art, and includes a wireless section 117, an audio processing section 118, a switching section 119, an amplifier section 120, an audio input/output section 121, a telephone number input section 122, a ring tone generating section 123, and a call control memory section 124.

The wireless section 117 transmits/receives various kinds of data, such as audio data, to/from the base station through an antenna 125. The audio processing section 118 encodes and decodes an audio signal input from the wireless section 117 or the amplifier section 120. The amplifier section 120 amplifies a signal input from the audio processing section 118 or the audio input/output section 121 up to a predetermined level. The audio input/output section 121 is formed by a speaker, a microphone, and the like, and amplifies a ring tone or incoming sound or collects the sound.

In addition, the ring tone generating section 123 generates a ring tone in response to a call from the base station. The switching section 119 switches the amplifier section 120, which is connected to the audio processing section 118, to the ring tone generating section 123 only when a call arrives, so that the ring tone generated in the ring tone generating section 123 is output to the audio input/output section 121 through the amplifier section 120.

In addition, the call control memory section 124 stores a program related to incoming and outgoing call control for communications. Moreover, the telephone number input section 122 includes, for example, numeric keys from 0 to 9 and other keys. The user inputs a telephone number of a communication destination by pressing these numeric keys and the like.

The voltage detecting section 116 detects a voltage drop when a voltage, which is applied from the power supply section 111 to each functional section, such as the control section 112, drops below the predetermined value, and notifies the control section 112 of the detection of the voltage drop. In this case, the predetermined voltage value is a value which is set beforehand as the lowest voltage necessary to operate the communication section 114 stably. For example, it is about 3 V. When the voltage drop is notified from the voltage detecting section 116, the control section 112 disables the operation of the wireless section 117, the audio processing section 118, the switching section 119, and the ring tone generating section 123. In particular, the operation of the wireless section 117 that consumes a large amount of power is necessarily stopped. In addition, a message informing the user that the communication section 114 is not available due to insufficient battery power is displayed on the display section 115.

That is, it is possible to disable the operation of the communication section 114 and display the notice on the display section 115 by the voltage detecting section 116 and the control section 112. This message may be a character message. Or as a more intuitive indication, a cross mark (X) may be displayed on a telephone icon displayed at the top of the display screen of the display section 115.

In addition, the function of the communication section 114 can be more reliably stopped by providing a power shutdown section 126 capable of selectively shutting down the power to a section related to the function of the communication section 114.

As described above, since the mobile information device 110 according to the present embodiment includes the high-quality piezoelectric vibrator 1 in which reliable airtightness in the cavity C is secured, and the yield is improved, it is possible to achieve an improvement in the operational reliability and high quality of the mobile information device itself which provides stable conductivity. In addition to this, it is possible to display highly accurate clock information which is stable over a long period of time.

(Radio-Controlled Timepiece)

Next, a radio-controlled timepiece according to still another embodiment of the invention will be described with reference to FIG. 27.

Figure 27:
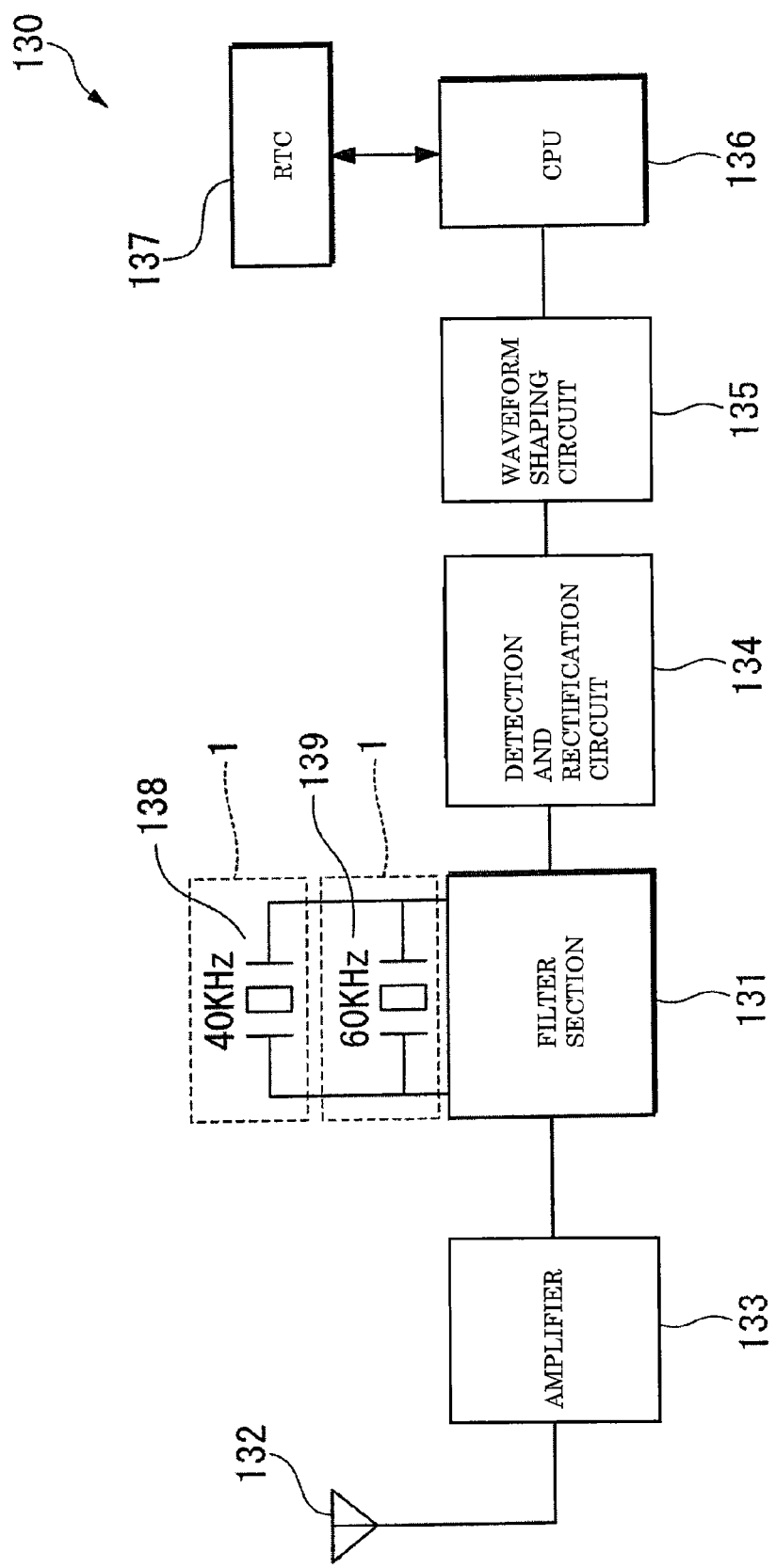
FIG. 27 is a view showing the configuration of a radio-controlled timepiece according to an embodiment of the invention.
Figure 28:
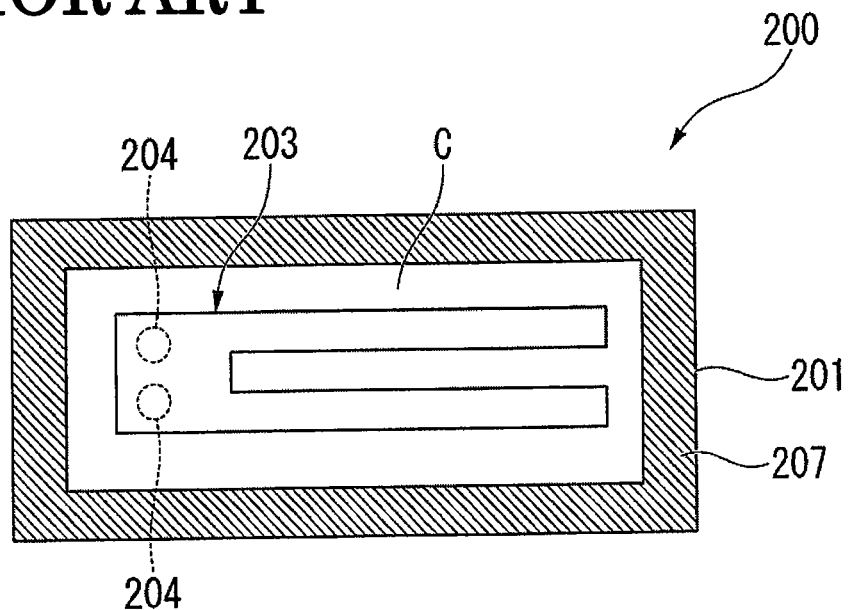
FIG. 28 is a top view showing an inner structure of a piezoelectric vibrator according to the related art when a piezoelectric vibrating reed is viewed from above with a lid substrate removed.
Figure 29:
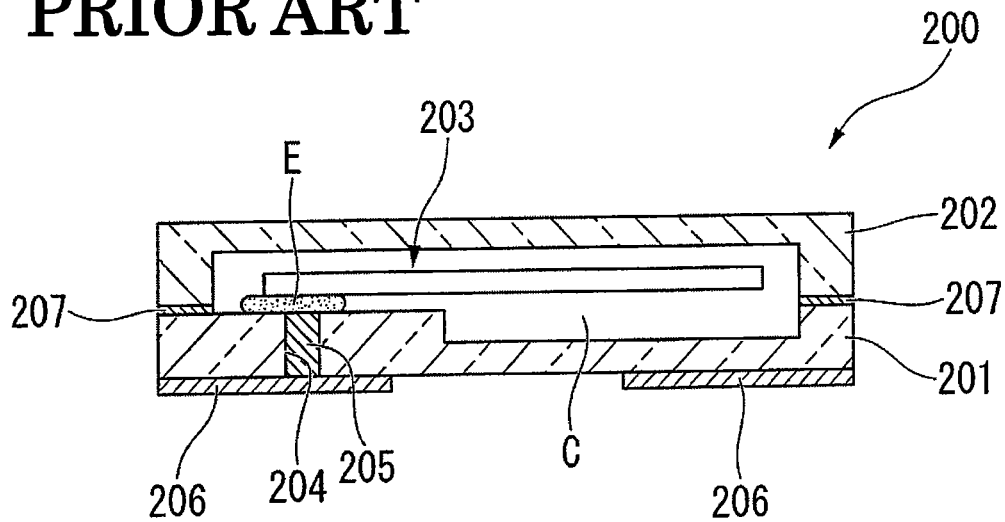
FIG. 29 is a cross-sectional view of the piezoelectric vibrator shown in FIG. 28.

As shown in FIG. 27, a radio-controlled timepiece 130 according to the present embodiment includes the piezoelectric vibrators 1 electrically connected to a filter section 131. The radio-controlled timepiece 130 is a timepiece with a function of receiving a standard radio wave including the clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionosphere and the land surface, and therefore has a propagation range wide enough to cover the entire area of Japan through the two transmission centers.

Hereinafter, the functional configuration of the radio-controlled timepiece 130 will be described in detail.

An antenna 132 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 133 and is then filtered and synchronized by the filter section 131 having the plurality of piezoelectric vibrators 1.

In the present embodiment, the piezoelectric vibrators 1 include crystal vibrator sections 138 and 139 having resonance frequencies of 40 kHz and 60 kHz, respectively, which are the same frequencies as the carrier frequency.

In addition, the filtered signal with a predetermined frequency is detected and demodulated by a detection and rectification circuit 134.

Then, the time code is extracted by a waveform shaping circuit 135 and counted by the CPU 136. The CPU 136 reads the information including the current year, the total number of days, the day of the week, the time, and the like. The read information is reflected on an RTC 137, and the correct time information is displayed.

Because the carrier wave is 40 kHz or 60 kHz, a vibrator having the tuning fork structure described above is suitable for the crystal vibrator sections 138 and 139.

Moreover, although the above explanation has been given for the case in Japan, the frequency of a long standard wave is different in other countries. For example, a standard wave of 77.5 kHz is used in Germany. Therefore, when the radio-controlled timepiece 130 which is also operable in other countries is assembled in a portable device, the piezoelectric vibrator 1 corresponding to frequencies different from the frequencies used in Japan is necessary.

As described above, since the radio-controlled timepiece 130 according to the present embodiment includes the piezoelectric vibrator 1 in which reliable airtightness in the cavity C is secured, and the yield is improved, it is possible to achieve an improvement in the operational reliability and high quality of the radio-controlled timepiece itself which provides stable conductivity. In addition to this, it is possible to count the time highly accurately and stably over a long period of time.

While the embodiments of the invention have been described in detail with reference to the accompanying drawings, the specific configuration is not limited to the above-described embodiments, and various changes may be made in design without departing from the spirit of the invention.

For example, although in the above-described embodiment, the through holes 30 and 31 have a conical shape having a tapered sectional shape, they may have an approximately cylindrical shape having a straight shape rather than the tapered sectional shape.

Moreover, the core portion 7 has been described as having a circular columnar shape, it may have a rectangular columnar shape. In this case, the same operational effect can be obtained.

In addition, in the above-described embodiment, it is preferable that the core portion 7 has approximately the same thermal expansion coefficient as the base substrate 2 (the base substrate wafer 40) and the cylindrical member 6.

In this case, when baking is performed, the three members, namely the base substrate wafer 40, the cylindrical member 6, and the core portion 7 will experience the same thermal expansion. Therefore, there will be no problems resulting from the different thermal expansion coefficients, for example, a case where excessive pressure is applied to the base substrate wafer 40 or the cylindrical member 6, thus forming cracks or the like, and a case where a gap is formed between the cylindrical member 6 and the through holes 30 and 31 or between the cylindrical member 6 and the core portion 7. Therefore, it is possible to form the penetration electrodes having higher quality, and accordingly, to achieve a further improvement in the quality of the piezoelectric vibrator 1.

For example, although the above-described embodiments have been described by way of an example of the grooved piezoelectric vibrating reed 4 in which the grooves 18 are formed on both surfaces of the vibrating arms 10 and 11 as an example of the piezoelectric vibrating reed 4, the piezoelectric vibrating reed 4 may be a type of piezoelectric vibrating reed without the grooves 18. However, since the field efficiency between the pair of the excitation electrodes 15 when a predetermined voltage is applied to the pair of excitation electrodes 15 can be increased by forming the grooves 18, it is possible to suppress the vibration loss further and to improve the vibration properties much more. That is to say, it is possible to decrease the CI value (Crystal Impedance) further and to improve the performance of the piezoelectric vibrating reed 4 further. In this respect, it is preferable to form the grooves 18.

In addition, although the embodiment has been described by way of an example of a tuning-fork type piezoelectric vibrating reed 4, the piezoelectric vibrating reed of the present invention is not limited to the tuning-fork type piezoelectric vibrating reed but may be a thickness-shear type piezoelectric vibrating reed, for example.

Moreover, although in the above-described embodiments, the base substrate 2 and the lid substrate 3 are anodically bonded by the bonding film 35, the bonding method is not limited to the anodic bonding. However, anodic bonding is preferable because the anodic bonding can tightly bond both substrates 2 and 3.

Furthermore, although in the above-described embodiments, the piezoelectric vibrating reed 4 is bonded through bumps, the bonding method is not limited to bump bonding. For example, the piezoelectric vibrating reed 4 may be bonded by a conductive adhesive agent. However, since the bump bonding allows the piezoelectric vibrating reed 4 to be floated from the upper surface of the base substrate 2, it is naturally possible to secure the minimum vibration gap necessary for vibration of the piezoelectric vibrating reed 4. Therefore, bump bonding is preferable.

In the above-described embodiment, although the length of the core portion 7 has been described as being set to a length shorter by a distance of 0.02 mm than the thickness of the base substrate wafer 40, the length can be freely set as long as the squeegee 45 does not make contact with the core portion 7 when the redundant glass paste 6a is removed by the squeegee 45.

In addition, in the present embodiment, the rivet member 9 in which the tip end of the core portion 7 had a flat surface before the polishing step was used, the tip end may not be a flat surface, and the length of the core portion 7 may be shorter than the thickness of the base substrate wafer 40 when the rivet members 9 are disposed in the through holes 30 and 31.

Moreover, in the above-described embodiment, the laminate material 70 has been described to have a size such that it covers the entire upper surface 40a of the base substrate wafer. However, the size of the laminate material 70 is not particularly limited if the laminate material 70 can cover the head portion 8 of the rivet member 9 and can be attached so that no gap is formed between the head portion 8 and the upper surface 40a of the base substrate wafer 40.

The method of manufacturing the piezoelectric vibrator according to the invention can be applied to a surface mounted device (SMD)-type piezoelectric vibrator in which a piezoelectric vibrating reed is sealed in a cavity formed between two bonded substrates.

What is claimed is:

1. A method of manufacturing a piezoelectric vibrator having a piezoelectric vibrating reed sealed in a cavity between a base substrate and a lid substrate, the method comprising:
    providing a conductive rivet member including a planar head portion and a core portion extending in a direction vertical to a surface of the head portion;
    inserting the core portion of the conductive rivet member into a penetration hole in the base substrate and bringing the head portion of the rivet member into contact with a first surface of the base substrate;
    attaching a laminate tape material having elastic properties to the first surface of the base substrate and covering the head portion;

applying a glass frit paste on a second surface of the base substrate and filling the glass frit paste in the penetration hole, while holding the head portion to the first surface of the base substrate with the laminate tape material; and baking and curing the glass frit paste to solidify the paste.

2. The method of manufacturing the piezoelectric vibrator according to claim 1, wherein a base wafer includes at least the one base substrate and a lid wafer includes at least the one lid substrate, and the piezoelectric vibrator is manufactured using the base wafer and the lid wafer, and wherein the method further comprises:

forming a recess in the lid wafer so as to form the cavity when the lid and base wafers are superimposed on each other;

forming a penetration electrode in the base wafer using the rivet member so as to penetrate through the base wafer;

forming a lead-out electrode on the first surface of the base wafer that is electrically connected to the penetration electrode;

bonding the piezoelectric vibrating reed to the first surface of the base wafer with the lead-out electrode disposed therebetween;

superimposing the base wafer and the lid wafer on each other so that the piezoelectric vibrating reed is received in the cavity surrounded by the recess between the base and lid wafers;

bonding the base wafer and the lid wafer to each other so that the piezoelectric vibrating reed is sealed in the cavity;

forming an external electrode on the second surface of the base wafer that is electrically connected to the penetration electrode; and cutting the bonded base and lid wafers to obtain a plurality of fragmented piezoelectric vibrators, wherein forming the penetration electrode further includes:

forming the penetration hole for disposing the penetration electrode in the base wafer;

disposing the core portion of the rivet member in the penetration hole of the base wafer;

attaching the laminate tape material having elastic properties to the first surface of the base wafer so as to cover the head portion of the rivet member;

filling the glass frit paste in a gap between the penetration hole and the core portion of the rivet member;

baking the glass frit paste at a predetermined temperature so that the penetration hole, the glass frit paste, and the core portion of the rivet member are integrally fixed to each other; and grinding and polishing the head portion of the rivet member and the first surface of the base wafer in which the head portion is disposed and polishing the second surface of the base wafer to thereby expose the core portion.

3. The method of manufacturing the piezoelectric vibrator according to claim 1, wherein the laminate tape material includes a tape body comprising a sheet and a thermoplastic adhesive applied on the tape body, and wherein the method further includes separating the laminate tape material from the first substrate after baking and curing the glass frit paste.

4. The method of manufacturing the piezoelectric vibrator according to claim 1, wherein the laminate tape material has a thickness of 50 μm to 200 μm.

* * * * *